US008909489B2

(12) United States Patent
Saruki et al.

(10) Patent No.: US 8,909,489 B2
(45) Date of Patent: Dec. 9, 2014

(54) ROTATING FIELD SENSOR

(75) Inventors: Shunji Saruki, Tokyo (JP); Hiraku Hirabayashi, Tokyo (JP); Yosuke Komasaki, Tokyo (JP)

(73) Assignee: TDK Corporation, Tokyo (JP)

( * ) Notice: Subject to any disclaimer, the term of this patent is extended or adjusted under 35 U.S.C. 154(b) by 359 days.

(21) Appl. No.: 13/176,485

(22) Filed: Jul. 5, 2011

(65) Prior Publication Data

US 2012/0053865 A1    Mar. 1, 2012

(30) Foreign Application Priority Data

Aug. 30, 2010   (JP) ................................. 2010-192211

(51) Int. Cl.
*G01R 33/09*   (2006.01)
*B82Y 25/00*   (2011.01)
*G01D 5/14*   (2006.01)

(52) U.S. Cl.
CPC ............... *G01R 33/093* (2013.01); *B82Y 25/00* (2013.01); *G01D 5/145* (2013.01)
USPC .................... 702/57; 324/207.25; 324/207.21

(58) Field of Classification Search
CPC ........ G01R 33/09; G01R 33/02; G01D 5/145; G01D 5/147; G06F 17/5036; G01P 3/487
USPC ............... 702/57, 145, 151, 189; 324/207.21, 324/207.25
See application file for complete search history.

(56) References Cited

U.S. PATENT DOCUMENTS

| 6,633,462 | B2 | 10/2003 | Adelerhof | |
| 6,943,544 | B2 * | 9/2005 | Waffenschmidt | ........ 324/207.21 |
| 2009/0206827 | A1 * | 8/2009 | Aimuta et al. | ........... 324/207.25 |
| 2010/0001721 | A1 * | 1/2010 | Inotsuka et al. | ......... 324/207.25 |

FOREIGN PATENT DOCUMENTS

| JP | A-2003-065795 | 3/2003 |
| JP | A-2004-504713 | 2/2004 |
| JP | A-2009-025319 | 2/2009 |
| JP | A-B2-4273363 | 6/2009 |

* cited by examiner

*Primary Examiner* — Michael Nghiem
*Assistant Examiner* — Yoshihisa Ishizuka
(74) *Attorney, Agent, or Firm* — Oliff PLC

(57) ABSTRACT

A first detection unit has first and second detection circuits. A second detection unit has third and fourth detection circuits. Output signals of the second and fourth detection circuits differ from output signals of the first and third detection circuits in phase, respectively, by an odd number of times ¼ the signal period. The output signal of the third detection circuit differs from the output signal of the first detection circuit in phase by an integer multiple of ⅙ the signal period other than an integer multiple of ½ the signal period. A rotating field sensor generates a first signal based on the output signals of the first and third detection circuits, generates a second signal based on the output signals of the second and fourth detection circuits, and calculates a detected angle value based on the first and second signals.

13 Claims, 23 Drawing Sheets

ROTATING FIELD SENSOR

BACKGROUND OF THE INVENTION

1. Field of the Invention

The present invention relates to a rotating field sensor for detecting an angle that the direction of a rotating magnetic field forms with respect to a reference direction.

2. Description of the Related Art

In recent years, rotating field sensors have been widely used to detect the rotational position of an object in various applications such as detecting the rotational position of an automotive steering wheel. Rotating field sensors are used not only to detect the rotational position of an object but also to detect a linear displacement of an object. Systems using rotating field sensors are typically provided with means (for example, a magnet) for generating a rotating magnetic field whose direction rotates in conjunction with the rotation or linear movement of the object. The rotating field sensors use magnetic detection elements to detect the angle that the direction of the rotating magnetic field forms with respect to a reference direction. The rotational position or linear displacement of the object is thus detected.

There has been known a rotating field sensor that has two bridge circuits (Wheatstone bridge circuits) as shown in U.S. Pat. Nos. 6,943,544 B2, 6,633,462 B2, and U.S. Patent Application Publication No. 2009/0206827 A1. In such a rotating field sensor, each of the two bridge circuits includes four magnetoresistive elements (hereinafter referred to as MR elements) serving as magnetic detection elements. Each of the bridge circuits detects the intensity of a component of the rotating magnetic field in one direction, and outputs a signal that indicates the intensity. The output signals of the two bridge circuits differ in phase by ¼ the period of the output signals of the bridge circuits. The angle that the direction of the rotating magnetic field forms with respect to a reference direction is calculated based on the output signals of the two bridge circuits.

In a rotating field sensor that uses MR elements as the magnetic detection elements, the waveforms of the output signals of the MR elements corresponding to the resistance values ideally trace a sinusoidal curve (including a sine waveform and a cosine waveform) as the direction of the rotating magnetic field rotates. However, it is known that the waveforms of the output signals of MR elements can be distorted from a sinusoidal curve, as described in U.S. Pat. No. 6,633,462 B2. If the waveforms of the output signals of the MR elements are distorted, the angle detected by the rotating field sensor may include some error. One of the causes of the distortion of the output signal waveforms of the MR elements is the MR elements themselves.

A description will now be given of an example in which the output signal waveforms of the MR elements are distorted due to the MR elements themselves. Here, assume that the MR elements are giant magnetoresistive (GMR) elements or tunneling magnetoresistive (TMR) elements. A GMR or TMR element includes a magnetization pinned layer whose direction of magnetization is pinned, a free layer whose direction of magnetization varies according to the direction of the rotating magnetic field, and a nonmagnetic layer disposed between the magnetization pinned layer and the free layer. One example of the situations where the output signal waveform of an MR element is distorted due to the MR element itself is when the direction of magnetization of the magnetization pinned layer varies due to the influence of the rotating magnetic field, etc. This is likely to occur when the intensity of the rotating magnetic field is relatively high. Another example of the situations where the output signal waveform of an MR element is distorted due to the MR element itself is when the direction of magnetization of the free layer does not coincide with the direction of the rotating magnetic field due to the influence of such factors as the shape anisotropy and coercivity of the free layer. This is likely to occur when the intensity of the rotating magnetic field is relatively low.

U.S. Pat. No. 6,633,462 B2 discloses a magnetoresistive sensor including a main sensing element having a main reference magnetization axis, and two correction sensing elements having their respective reference magnetization axes inclined with respect to the main reference magnetization axis. The two correction sensing elements are electrically connected to the main sensing element to correct the detected angle. In this sensor, however, the design of the correction sensing elements needs to be optimized according to the design conditions such as the resistances, sizes and materials of the main sensing element and the correction sensing elements and the intensity of the rotating magnetic field. This poses a problem that the design of the sensor is not easy.

As has been described, a rotating field sensor that uses MR elements as the magnetic detection elements has the problem that the angle detected by the rotating field sensor may include some error. However, this problem can occur in any rotating field sensor that includes magnetic detection elements to detect the angle that the direction of a rotating magnetic field forms with respect to a reference direction.

OBJECT AND SUMMARY OF THE INVENTION

It is an object of the present invention to provide a rotating field sensor for detecting an angle that the direction of a rotating magnetic field forms with respect to a reference direction, the rotating field sensor being capable of reducing the error in the detected angle.

A rotating field sensor of the present invention detects an angle that the direction of a rotating magnetic field in a reference position forms with respect to a reference direction. The rotating field sensor includes a first detection unit that detects the rotating magnetic field in a first position, and a second detection unit that detects the rotating magnetic field in a second position.

The first detection unit has a first detection circuit that detects the intensity of a component of the rotating magnetic field in a first direction and outputs a signal indicating the intensity, and a second detection circuit that detects the intensity of a component of the rotating magnetic field in a second direction and outputs a signal indicating the intensity. The second detection unit has a third detection circuit that detects the intensity of a component of the rotating magnetic field in a third direction and outputs a signal indicating the intensity, and a fourth detection circuit that detects the intensity of a component of the rotating magnetic field in a fourth direction and outputs a signal indicating the intensity. Each of the first to fourth detection circuits includes at least one magnetic detection element.

The output signals of the first to fourth detection circuits make periodic changes with the same signal period. The output signal of the third detection circuit differs from the output signal of the first detection circuit in phase. The output signal of the fourth detection circuit differs from the output signal of the second detection circuit in phase.

The rotating field sensor of the present invention further includes a first, a second, and a third arithmetic circuit. The first arithmetic circuit generates, based on the output signals of the first and third detection circuits, a first signal having a correspondence relationship with both the intensity of the component of the rotating magnetic field in the first direction and the intensity of the component of the rotating magnetic field in the third direction, the first signal including a reduced error component with a period of ⅓ the signal period, as compared with the output signals of the first and third detection circuits. The second arithmetic circuit generates, based on the output signals of the second and fourth detection circuits, a second signal having a correspondence relationship with both the intensity of the component of the rotating magnetic field in the second direction and the intensity of the component of the rotating magnetic field in the fourth direction, the second signal including a reduced error component with a period of ⅓ the signal period, as compared with the output signals of the second and fourth detection circuits. The third arithmetic circuit calculates, based on the first and second signals, a detected angle value having a correspondence relationship with the angle that the direction of the rotating magnetic field in the reference position forms with respect to the reference direction.

In the rotating field sensor of the present invention, the output signals of the first to fourth detection circuits may each include an error component with a period of ⅓ the signal period that is caused by the magnetic detection elements. According to the rotating field sensor of the present invention, the first arithmetic circuit generates a first signal, and the second arithmetic circuit generates a second signal. The first signal includes a reduced error component with a period of ⅓ the signal period, as compared with the output signals of the first and third detection circuits. The second signal includes a reduced error component with a period of ⅓ the signal period, as compared with the output signals of the second and fourth detection circuits. Based on the first and second signals, the third arithmetic circuit calculates a detected angle value having a correspondence relationship with the angle that the direction of the rotating magnetic field in the reference position forms with respect to the reference direction. Consequently, according to the present invention, it is possible to reduce the error caused by the magnetic detection elements in the angle detected by the rotating field sensor. As used herein, the phrase "reduced error component" means that the ratio of the amplitude of the error component to the amplitude of the signal is reduced.

Preferably, in the rotating field sensor of the present invention, the output signal of the second detection circuit differs from the output signal of the first detection circuit in phase by an odd number of times ¼ the signal period. Preferably, the output signal of the third detection circuit differs from the output signal of the first detection circuit in phase by an integer multiple of ⅙ the signal period other than an integer multiple of ½ the signal period. Also preferably, the output signal of the fourth detection circuit differs from the output signal of the third detection circuit in phase by an odd number of times ¼ the signal period. The aforementioned preferable configuration makes it possible that, when the first arithmetic circuit generates the first signal based on the output signals of the first and third detection circuits, the error components included in the respective output signals of the first and third detection circuits cancel each other out. As a result of the aforementioned preferable configuration, the output signal of the second detection circuit and the output signal of the fourth detection circuit differ in phase by an integer multiple of ⅙ the signal period (other than an integer multiple of ½ the signal period). This makes it possible that, when the second arithmetic circuit generates the second signal based on the output signals of the second and fourth detection circuits, the error components included in the respective output signals of the second and fourth detection circuits cancel each other out. Consequently, the aforementioned preferable configuration allows more effective reduction of the error caused by the magnetic detection elements in the angle detected by the rotating field sensor.

In the aforementioned preferable configuration, the first position and the second position may be identical with each other in the direction of rotation of the rotating magnetic field, and the first direction and the third direction may be different from each other in the direction of rotation of the rotating magnetic field by a spatial angle equivalent to an integer multiple of ⅙ the signal period other than an integer multiple of ½ the signal period.

In the aforementioned preferable configuration of the rotating field sensor of the present invention, the first position and the second position may be different from each other, and the difference between the first position and the second position may be equivalent to an integer multiple of ⅙ the signal period other than an integer multiple of ½ the signal period.

In the rotating field sensor of the present invention, each of the first to fourth detection circuits may include, as the at least one magnetic detection element, a pair of magnetic detection elements connected in series. In this case, each of the first to fourth detection circuits may have a Wheatstone bridge circuit that includes a first pair of magnetic detection elements connected in series and a second pair of magnetic detection elements connected in series. The magnetic detection elements may be magnetoresistive elements. Each of the magnetoresistive elements may have a magnetization pinned layer whose direction of magnetization is pinned, a free layer whose direction of magnetization varies according to the direction of the rotating magnetic field, and a nonmagnetic layer disposed between the magnetization pinned layer and the free layer. The directions of magnetization of the magnetization pinned layers of the magnetoresistive elements in the second detection circuit may be orthogonal to those of the magnetization pinned layers of the magnetoresistive elements in the first detection circuit. The directions of magnetization of the magnetization pinned layers of the magnetoresistive elements in the fourth detection circuit may be orthogonal to those of the magnetization pinned layers of the magnetoresistive elements in the third detection circuit.

The rotating field sensor of the present invention may further include a third detection unit that detects the rotating magnetic field in a third position, and a fourth detection unit that detects the rotating magnetic field in a fourth position. The third detection unit has a fifth detection circuit that detects the intensity of a component of the rotating magnetic field in a fifth direction and outputs a signal indicating the intensity, and a sixth detection circuit that detects the intensity of a component of the rotating magnetic field in a sixth direction and outputs a signal indicating the intensity. The fourth detection unit has a seventh detection circuit that detects the intensity of a component of the rotating magnetic field in a seventh direction and outputs a signal indicating the intensity, and an eighth detection circuit that detects the intensity of a component of the rotating magnetic field in an eighth direction and outputs a signal indicating the intensity. Each of the fifth to eighth detection circuits includes at least one magnetic detection element.

The output signals of the first to eighth detection circuits make periodic changes with the same signal period. The output signal of the seventh detection circuit differs from the output signal of the fifth detection circuit in phase. The output signal of the eighth detection circuit differs from the output signal of the sixth detection circuit in phase.

The rotating field sensor of the present invention further includes a fourth, a fifth, a sixth, and a seventh arithmetic circuit. The fourth arithmetic circuit generates, based on the output signals of the fifth and seventh detection circuits, a third signal having a correspondence relationship with both the intensity of the component of the rotating magnetic field in the fifth direction and the intensity of the component of the rotating magnetic field in the seventh direction, the third signal including a reduced error component with a period of ⅓ the signal period, as compared with the output signals of the fifth and seventh detection circuits. The fifth arithmetic circuit generates, based on the output signals of the sixth and eighth detection circuits, a fourth signal having a correspondence relationship with both the intensity of the component of the rotating magnetic field in the sixth direction and the intensity of the component of the rotating magnetic field in the eighth direction, the fourth signal including a reduced error component with a period of ⅓ the signal period, as compared with the output signals of the sixth and eighth detection circuits. The sixth arithmetic circuit calculates, based on the third and fourth signals, a second detected angle value having a correspondence relationship with the angle that the direction of the rotating magnetic field in the reference position forms with respect to the reference direction. The seventh arithmetic circuit calculates a detected value of the angle that the direction of the rotating magnetic field in the reference position forms with respect to the reference direction, based on a first detected angle value, which is the detected angle value calculated by the third arithmetic circuit, and the second detected angle value calculated by the sixth arithmetic circuit.

In the case where the rotating field sensor of the present invention includes the third and fourth detection units and the fourth to seventh arithmetic circuits mentioned above, the output signal of the second detection circuit preferably differs from the output signal of the first detection circuit in phase by an odd number of times ¼ the signal period. The output signal of the third detection circuit preferably differs from the output signal of the first detection circuit in phase by an integer multiple of ⅙ the signal period other than an integer multiple of ½ the signal period. The output signal of the fourth detection circuit preferably differs from the output signal of the third detection circuit in phase by an odd number of times ¼ the signal period. The output signal of the sixth detection circuit preferably differs from the output signal of the fifth detection circuit in phase by an odd number of times ¼ the signal period. The output signal of the seventh detection circuit preferably differs from the output signal of the fifth detection circuit in phase by an integer multiple of ⅙ the signal period other than an integer multiple of ½ the signal period. The output signal of the eighth detection circuit preferably differs from the output signal of the seventh detection circuit in phase by an odd number of times ¼ the signal period.

In the case where the rotating field sensor of the present invention includes the third and fourth detection units and the fourth to seventh arithmetic circuits mentioned above, the first detected angle value may include a first angular error with respect to a theoretical value of the first detected angle value that is expected when the direction of the rotating magnetic field rotates ideally, and the second detected angle value may include a second angular error with respect to a theoretical value of the second detected angle value that is expected when the direction of the rotating magnetic field rotates ideally. The first and second angular errors may make periodic changes with the same angular error period in response to a change of the direction of the rotating magnetic field. The changes of the first angular error and the second angular error may depend on the change of the direction of the rotating magnetic field. In this case, the third position and the fourth position may be offset from the first position and the second position, respectively, by an amount equivalent to an odd number of times ½ the angular error period. The angular error period in this case may be ½ the period of the rotation of the direction of the rotating magnetic field.

According to the rotating field sensor of the present invention, there are generated a first signal and a second signal. The first signal includes a reduced error component with a period of ⅓ the signal period, as compared with the output signals of the first and third detection circuits. The second signal includes a reduced error component with a period of ⅓ the signal period, as compared with the output signals of the second and fourth detection circuits. A detected angle value having a correspondence relationship with the angle that the direction of the rotating magnetic field in the reference position forms with respect to the reference direction is calculated based on the first and second signals. Consequently, according to the present invention, it is possible to reduce the error in the angle detected by the rotating field sensor.

Other and further objects, features and advantages of the present invention will appear more fully from the following description.

DETAILED DESCRIPTION OF THE PREFERRED EMBODIMENTS

[First Embodiment]

Figure 1:
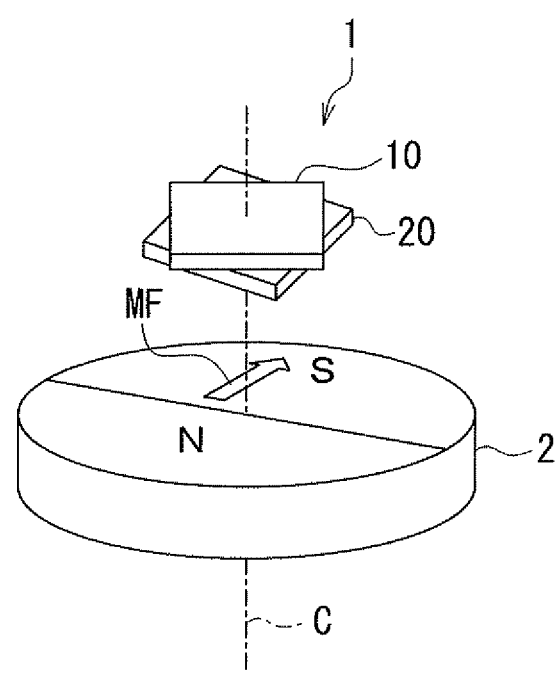
FIG. 1 is a perspective view showing the general configuration of a rotating field sensor according to a first embodiment of the invention.
Figure 2:
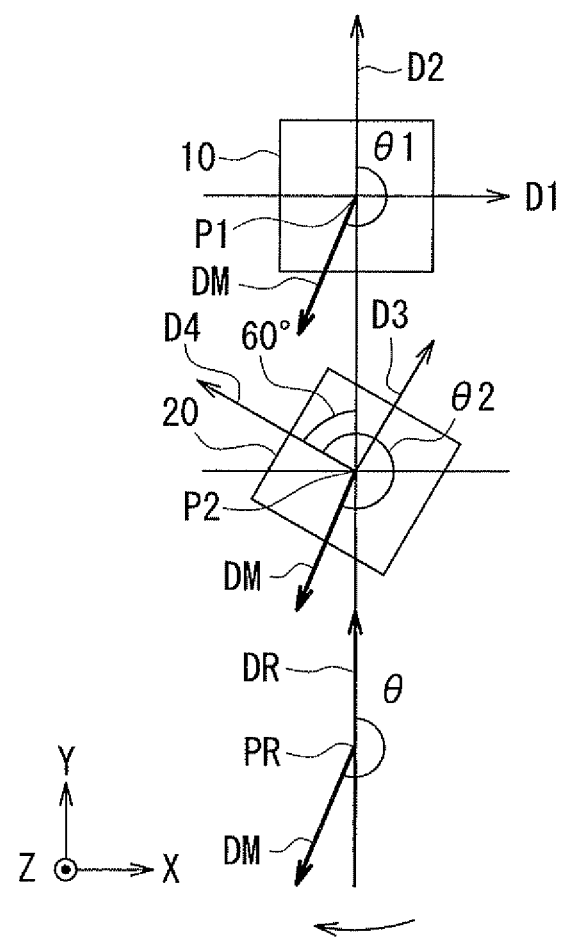
FIG. 2 is an explanatory diagram illustrating the definitions of directions and angles in the first embodiment of the invention.

Preferred embodiments of the present invention will now be described in detail with reference to the drawings. First, reference is made to FIG. 1 and FIG. 2 to describe the general configuration of a rotating field sensor according to a first embodiment of the invention. FIG. 1 is a perspective view showing the general configuration of the rotating field sensor according to the present embodiment. FIG. 2 is an explanatory diagram illustrating the definitions of directions and angles in the present embodiment.

As shown in FIG. 1, the rotating field sensor 1 according to the present embodiment detects the angle that the direction of a rotating magnetic field MF in a reference position forms with respect to a reference direction. In FIG. 1, a cylindrical magnet 2 is shown as an example of means for generating the rotating magnetic field MF whose direction rotates. The magnet 2 has an N pole and an S pole that are arranged symmetrically with respect to a virtual plane including the central axis of the cylinder. The magnet 2 rotates about the central axis of the cylinder. Consequently, the direction of the rotating magnetic field MF generated by the magnet 2 rotates about a center of rotation C including the central axis of the cylinder. The rotating field sensor 1 is disposed to face one end face of the magnet 2. The means for generating the rotating magnetic field MF whose direction rotates is not limited to the magnet 2 shown in FIG. 1, as will be described later in relation to other embodiments.

The rotating field sensor 1 includes a first detection unit 10 that detects the rotating magnetic field MF in a first position, and a second detection unit 20 that detects the rotating magnetic field MF in a second position. In FIG. 1, the first detection unit 10 and the second detection unit 20 are shown as separate members, for ease of understanding. However, the first detection unit 10 and the second detection unit 20 may be integrated with each other.

With reference to FIG. 2, the definitions of directions and angles in the present embodiment will be described. First, a direction that is parallel to the center of rotation C shown in FIG. 1 and is from the one end face of the magnet 2 to the rotating field sensor 1 will be defined as the Z direction. Next, two mutually-orthogonal directions on a virtual plane perpendicular to the Z direction will be defined as the X direction and Y direction. In FIG. 2, the X direction is shown as the direction toward the right, and the Y direction is shown as the upward direction. The direction opposite to the X direction will be defined as the −X direction, and the direction opposite to the Y direction will be defined as the −Y direction.

The reference position PR is the position where the rotating field sensor 1 detects the rotating magnetic field MF. For example, the reference position PR shall be where the first detection unit 10 is located. The reference direction DR shall be the Y direction. The angle that the direction DM of the rotating magnetic field MF in the reference position PR forms with respect to the reference direction DR will be designated by symbol θ. The direction DM of the rotating magnetic field MF shall rotate clockwise in FIG. 2. The angle θ will be expressed in a positive value when seen clockwise from the reference direction DR, and in a negative value when seen counterclockwise from the reference direction DR.

The first detection unit 10 detects, in the first position P1, a component of the rotating magnetic field MF in a first direction D1 and a component of the rotating magnetic field MF in a second direction D2. The second detection unit 20 detects, in the second position P2, a component of the rotating magnetic field MF in a third direction D3 and a component of the rotating magnetic field MF in a fourth direction D4. In the present embodiment, the first direction D1 and the second direction D2 are orthogonal to each other, and the third direction D3 and the fourth direction D4 are also orthogonal to each other. The first position P1 and the second position P2 are identical with each other in the direction of rotation of the rotating magnetic field MF and coincide with the reference position PR. The first direction D1 and the third direction D3 differ from each other by 60° in the direction of rotation of the rotating magnetic field MF.

In the present embodiment, the second direction D2 coincides with the reference direction DR (the Y direction). The angle that the direction DM of the rotating magnetic field MF in the first position P1 forms with respect to the second direction D2 will be referred to as a first angle and designated by symbol θ1. The definition of the sign of the angle θ1 is the same as that of the angle θ. In the present embodiment, the angle θ1 coincides with the angle θ. The first direction D1 is a direction rotated from the second direction D2 by 90°.

The third direction D3 is a direction rotated from the first direction D1 by −60°, and the fourth direction D4 is a direction rotated from the second direction D2 by −60°. The third direction D3 is also a direction rotated from the fourth direction D4 by 90°. The angle that the direction DM of the rotating magnetic field MF in the second position P2 forms with respect to the fourth direction D4 will be referred to as a second angle and designated by symbol θ2. The definition of the sign of the angle θ2 is the same as that of the angle θ. In the present embodiment, the angle θ2 is greater than the angle θ by 60°.

Figure 3:
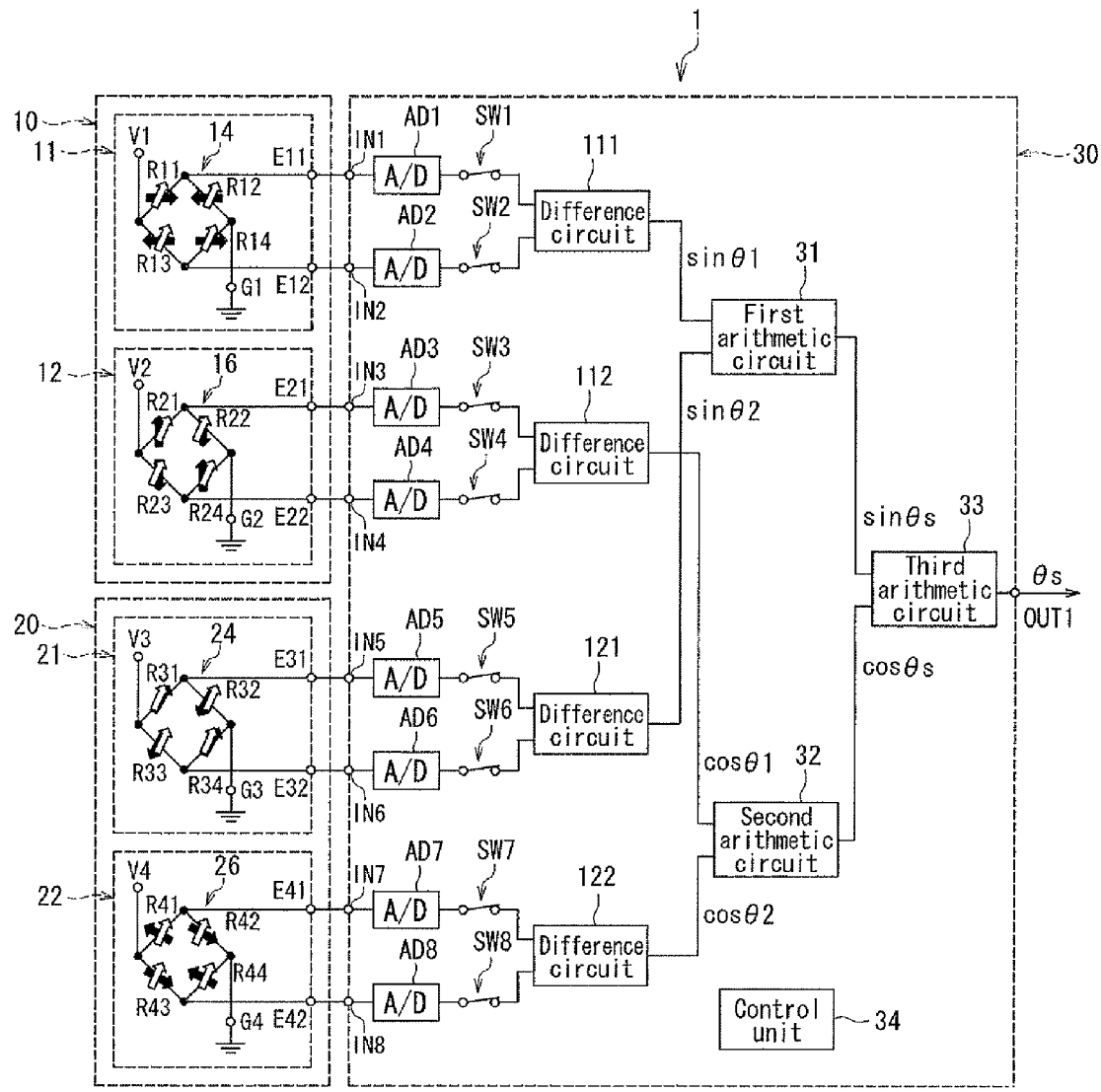
FIG. 3 is a circuit diagram showing the configuration of the rotating field sensor according to the first embodiment of the invention.

Next, the configuration of the rotating field sensor 1 will be described in detail with reference to FIG. 3. FIG. 3 is a circuit diagram showing the configuration of the rotating field sensor 1. As already mentioned, the rotating field sensor 1 includes the first detection unit 10 and the second detection unit 20. The first detection unit 10 has a first detection circuit 11 and a second detection circuit 12. The first detection circuit 11 detects the intensity of the component of the rotating magnetic field MF in the first direction D1 and outputs a signal indicating the intensity. The second detection circuit 12 detects the intensity of the component of the rotating magnetic field MF in the second direction D2 and outputs a signal indicating the intensity. The second detection unit 20 has a third detection circuit 21 and a fourth detection circuit 22. The third detection circuit 21 detects the intensity of the component of the rotating magnetic field MF in the third direction D3 and outputs a signal indicating the intensity. The fourth detection circuit 22 detects the intensity of the component of the rotating magnetic field MF in the fourth direction D4 and outputs a signal indicating the intensity. Each of the first to fourth detection circuits 11, 12, 21, and 22 includes at least one magnetic detection element.

The output signals of the first to fourth detection circuits 11, 12, 21, and 22 make periodic changes with the same signal period T. The output signal of the third detection circuit 21 differs from the output signal of the first detection circuit 11 in phase. The output signal of the fourth detection circuit 22 differs from the output signal of the second detection circuit 12 in phase. In the present embodiment, the phases of the output signals of the first to fourth detection circuits 11, 12, 21, and 22 preferably satisfy the following particular relationships.

Preferably, the output signal of the second detection circuit 12 differs from the output signal of the first detection circuit 11 in phase by an odd number of times ¼ the signal period T. Also preferably, the output signal of the fourth detection circuit 22 differs from the output signal of the third detection circuit 21 in phase by an odd number of times ¼ the signal period T. However, in consideration of the production accuracy of the magnetic detection elements and other factors, the difference in phase between the output signal of the first detection circuit 11 and the output signal of the second detection circuit 12 and the difference in phase between the output signal of the third detection circuit 21 and the output signal of the fourth detection circuit 22 can each be slightly different from an odd number of times ¼ the signal period T.

Preferably, the output signal of the third detection circuit 21 differs from the output signal of the first detection circuit 11 in phase by an integer multiple of ⅙ the signal period T other than an integer multiple of ½ the signal period T. The phrase "an integer multiple of ⅙ the signal period T other than an integer multiple of ½ the signal period T" means one of integer multiples of ⅙ the signal period T excluding integer multiples (including a zero multiple) of ½ the signal period T. The following description assumes that the phases of the output signals of the first to fourth detection circuits 11, 12, 21, and 22 satisfy the preferred relationships described above.

Each of the first to fourth detection circuits 11, 12, 21, and 22 may include, as the at least one magnetic detection element, a pair of magnetic detection elements connected in series. In this case, each of the first to fourth detection circuits 11, 12, 21, and 22 may have a Wheatstone bridge circuit that includes a first pair of magnetic detection elements connected in series and a second pair of magnetic detection elements connected in series. The following description will deal with the case where each of the first to fourth detection circuits 11, 12, 21, and 22 has such a Wheatstone bridge circuit.

The first detection circuit 11 has a Wheatstone bridge circuit 14. The Wheatstone bridge circuit 14 includes a power supply port V1, a ground port G1, two output ports E11 and E12, a first pair of magnetic detection elements R11 and R12 connected in series, and a second pair of magnetic detection elements R13 and R14 connected in series. One end of each of the magnetic detection elements R11 and R13 is connected to the power supply port V1. The other end of the magnetic detection element R11 is connected to one end of the magnetic detection element R12 and the output port E11. The other end of the magnetic detection element R13 is connected to one end of the magnetic detection element R14 and the output port E12. The other end of each of the magnetic detection elements R12 and R14 is connected to the ground port G1. A power supply voltage of predetermined magnitude is applied to the power supply port V1. The ground port G1 is grounded.

The second detection circuit 12 has a Wheatstone bridge circuit 16. The Wheatstone bridge circuit 16 includes a power supply port V2, a ground port G2, two output ports E21 and E22, a first pair of magnetic detection elements R21 and R22 connected in series, and a second pair of magnetic detection elements R23 and R24 connected in series. One end of each of the magnetic detection elements R21 and R23 is connected to the power supply port V2. The other end of the magnetic detection element R21 is connected to one end of the magnetic detection element R22 and the output port E21. The other end of the magnetic detection element R23 is connected to one end of the magnetic detection element R24 and the output port E22. The other end of each of the magnetic detection elements R22 and R24 is connected to the ground port G2. A power supply voltage of predetermined magnitude is applied to the power supply port V2. The ground port G2 is grounded.

The third detection circuit 21 has a Wheatstone bridge circuit 24. The Wheatstone bridge circuit 24 includes a power supply port V3, a ground port G3, two output ports E31 and E32, a first pair of magnetic detection elements R31 and R32 connected in series, and a second pair of magnetic detection elements R33 and R34 connected in series. One end of each of the magnetic detection elements R31 and R33 is connected to the power supply port V3. The other end of the magnetic detection element R31 is connected to one end of the magnetic detection element R32 and the output port E31. The other end of the magnetic detection element R33 is connected to one end of the magnetic detection element R34 and the output port E32. The other end of each of the magnetic detection elements R32 and R34 is connected to the ground port G3. A power supply voltage of predetermined magnitude is applied to the power supply port V3. The ground port G3 is grounded.

The fourth detection circuit 22 has a Wheatstone bridge circuit 26. The Wheatstone bridge circuit 26 includes a power supply port V4, a ground port G4, two output ports E41 and E42, a first pair of magnetic detection elements R41 and R42 connected in series, and a second pair of magnetic detection elements R43 and R44 connected in series. One end of each of the magnetic detection elements R41 and R43 is connected to the power supply port V4. The other end of the magnetic detection element R41 is connected to one end of the magnetic detection element R42 and the output port E41. The other end of the magnetic detection element R43 is connected to one end of the magnetic detection element R44 and the output port E42. The other end of each of the magnetic detection elements R42 and R44 is connected to the ground port G4. A power supply voltage of predetermined magnitude is applied to the power supply port V4. The ground port G4 is grounded.

In the present embodiment, all the magnetic detection elements included in the Wheatstone bridge circuits (hereinafter, referred to as bridge circuits) 14, 16, 24, and 26 are MR elements, or TMR elements in particular.

GMR elements may be employed instead of the TMR elements. The TMR elements or GMR elements each have a magnetization pinned layer whose direction of magnetization is pinned, a free layer whose direction of magnetization varies according to the direction of the rotating magnetic field MF, and a nonmagnetic layer disposed between the magnetization pinned layer and the free layer. For TMR elements, the nonmagnetic layer is a tunnel barrier layer. For GMR elements, the nonmagnetic layer is a nonmagnetic conductive layer. The TMR elements or GMR elements vary in resistance depending on the angle that the direction of magnetization of the free layer forms with respect to the direction of magnetization of the magnetization pinned layer. The resistance reaches its minimum value when the foregoing angle is 0°. The resistance reaches its maximum value when the foregoing angle is 180°. In the following description, the magnetic detection elements included in the bridge circuits 14, 16, 24, and 26 will be referred to as MR elements. In FIG. 3, the filled arrows indicate the directions of magnetization of the magnetization pinned layers in the MR elements. The hollow arrows indicate the directions of magnetization of the free layers in the MR elements.

In the first detection circuit 11, the magnetization pinned layers of the MR elements R11 and R14 are magnetized in a direction parallel to the first direction D1, and the magnetization pinned layers of the MR elements R12 and R13 are magnetized in a direction opposite to the direction of magnetization of the magnetization pinned layers of the MR elements R11 and R14. In this case, the potential difference between the output ports E11 and E12 varies according to the intensity of the component of the rotating magnetic field MF in the first direction D1. The first direction D1 therefore serves as a reference direction when the first detection circuit 11 detects the rotating magnetic field MF. The first detection circuit 11 detects the intensity of the component of the rotating magnetic field MF in the first direction D1, and outputs a signal that indicates the intensity. Specifically, the potential difference between the output ports E11 and E12 is the output signal of the first detection circuit 11. In the example shown in FIG. 3, the magnetization pinned layers of the MR elements R11 and R14 are magnetized in the X direction, and the magnetization pinned layers of the MR elements R12 and R13 are magnetized in the −X direction. In such an example, the first direction D1 is the same as the X direction.

In the second detection circuit 12, the magnetization pinned layers of the MR elements R21 and R24 are magnetized in a direction parallel to the second direction D2, and the magnetization pinned layers of the MR elements R22 and R23 are magnetized in a direction opposite to the direction of magnetization of the magnetization pinned layers of the MR elements R21 and R24. In this case, the potential difference between the output ports E21 and E22 varies according to the intensity of the component of the rotating magnetic field MF in the second direction D2. The second direction D2 therefore serves as a reference direction when the second detection circuit 12 detects the rotating magnetic field MF. The second detection circuit 12 detects the intensity of the component of the rotating magnetic field MF in the second direction D2, and outputs a signal that indicates the intensity. Specifically, the potential difference between the output ports E21 and E22 is the output signal of the second detection circuit 12. In the example shown in FIG. 3, the magnetization pinned layers of the MR elements R21 and R24 are magnetized in the Y direction, and the magnetization pinned layers of the MR elements R22 and R23 are magnetized in the −Y direction. In such an example, the second direction D2 is the same as the Y direction.

In the third detection circuit 21, the magnetization pinned layers of the MR elements R31 and R34 are magnetized in a direction parallel to the third direction D3, and the magnetization pinned layers of the MR elements R32 and R33 are magnetized in a direction opposite to the direction of magnetization of the magnetization pinned layers of the MR elements R31 and R34. In this case, the potential difference between the output ports E31 and E32 varies according to the intensity of the component of the rotating magnetic field MF in the third direction D3. The third direction D3 therefore serves as a reference direction when the third detection circuit 21 detects the rotating magnetic field MF. The third detection circuit 21 detects the intensity of the component of the rotating magnetic field MF in the third direction D3, and outputs a signal that indicates the intensity. Specifically, the potential difference between the output ports E31 and E32 is the output signal of the third detection circuit 21. In the example shown in FIG. 3, the magnetization pinned layers of the MR elements R31 and R34 are magnetized in the same direction as the third direction D3 shown in FIG. 2, and the magnetization pinned layers of the MR elements R32 and R33 are magnetized in a direction opposite to the third direction D3.

In the fourth detection circuit 22, the magnetization pinned layers of the MR elements R41 and R44 are magnetized in a direction parallel to the fourth direction D4, and the magnetization pinned layers of the MR elements R42 and R43 are magnetized in a direction opposite to the direction of magnetization of the magnetization pinned layers of the MR elements R41 and R44. In this case, the potential difference between the output ports E41 and E42 varies according to the intensity of the component of the rotating magnetic field MF in the fourth direction D4. The fourth direction D4 therefore serves as a reference direction when the fourth detection circuit 22 detects the rotating magnetic field MF. The fourth detection circuit 22 detects the intensity of the component of the rotating magnetic field MF in the fourth direction D4, and outputs a signal that indicates the intensity. Specifically, the potential difference between the output ports E41 and E42 is the output signal of the fourth detection circuit 22. In the example shown in FIG. 3, the magnetization pinned layers of the MR elements R41 and R44 are magnetized in the same direction as the fourth direction D4 shown in FIG. 2, and the magnetization pinned layers of the MR elements R42 and R43 are magnetized in a direction opposite to the fourth direction D4.

In consideration of the production accuracy of the MR elements and other factors, the magnetization pinned layers of the plurality of MR elements in the detection circuits 11, 12, 21, and 22 may be magnetized in directions that are slightly different from the above-described directions.

Figure 4:
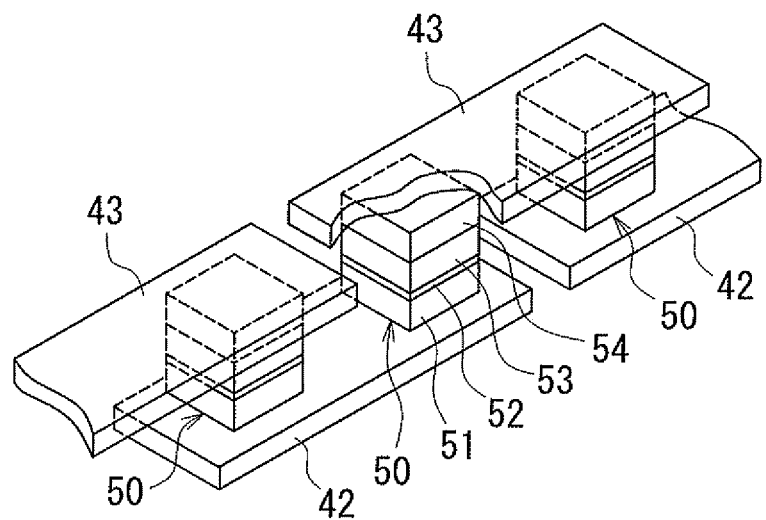
FIG. 4 is a perspective view showing part of an MR element shown in FIG. 3.

An example of the configuration of the MR elements will now be described with reference to FIG. 4. FIG. 4 is a perspective view showing a part of an MR element in the rotating field sensor 1 shown in FIG. 3. In this example, the MR element has a plurality of lower electrodes, a plurality of MR films, and a plurality of upper electrodes. The plurality of lower electrodes 42 are arranged on a not-shown substrate. Each of the lower electrodes 42 has a long slender shape. Two lower electrodes 42 adjoining in the longitudinal direction of the lower electrodes 42 have a gap therebetween. As shown in FIG. 4, MR films 50 are provided on the top surfaces of the lower electrodes 42, near opposite ends in the longitudinal direction. Each of the MR films 50 includes a free layer 51, a nonmagnetic layer 52, a magnetization pinned layer 53, and an antiferromagnetic layer 54 that are stacked in this order, the free layer 51 being closest to the lower electrode 42. The free layer 51 is electrically connected to the lower electrode 42. The antiferromagnetic layer 54 is made of an antiferromagnetic material. The antiferromagnetic layer 54 is in exchange coupling with the magnetization pinned layer 53 so as to pin the direction of magnetization of the magnetization pinned layer 53. The plurality of upper electrodes 43 are arranged over the plurality of MR films 50. Each of the upper electrodes 43 has a long slender shape, and establishes electrical connection between the respective antiferromagnetic layers 54 of two adjoining MR films 50 that are arranged on two lower electrodes 42 adjoining in the longitudinal direction of the lower electrodes 42. With such a configuration, the plurality of MR films 50 in the MR element shown in FIG. 4 are connected in series by the plurality of lower electrodes 42 and the plurality of upper electrodes 43. It should be appreciated that the layers 51 to 54 of the MR films 50 may be stacked in an order reverse to that shown in FIG. 4.

The rotating field sensor 1 further includes an arithmetic unit 30. As shown in FIG. 3, the arithmetic unit 30 includes first to third arithmetic circuits 31, 32, and 33. The first arithmetic circuit 31 generates, based on the output signals of the first and third detection circuits 11 and 21, a first signal that has a correspondence relationship with both the intensity of the component of the rotating magnetic field MF in the first direction D1 and the intensity of the component of the rotating magnetic field MF in the third direction D3. The second arithmetic circuit 32 generates, based on the output signals of the second and fourth detection circuits 12 and 22, a second signal that has a correspondence relationship with both the intensity of the component of the rotating magnetic field MF in the second direction D2 and the intensity of the component of the rotating magnetic field MF in the fourth direction D4. Based on the first signal and the second signal, the third arithmetic circuit 33 calculates a detected angle value $\theta s$ that has a correspondence relationship with the angle $\theta$ that the direction DM of the rotating magnetic field MF in the reference position PR forms with respect to the reference direction DR. The first to third arithmetic circuits 31, 32, and 33 can be implemented by a single microcomputer, for example. The method of generating the first and second signals and the method of calculating the detected angle value $\theta s$ will be described in detail later.

The arithmetic unit 30 further has eight input ports IN1 to IN8 and an output port OUT1. The input ports IN1 to IN8 are connected to the output ports E11, E12, E21, E22, E31, E32, E41, and E42, respectively.

The arithmetic unit 30 further has eight analog-digital converters (hereinafter referred to as A/D converters) AD1 to AD8 and eight switches SW1 to SW8. Each of the switches SW1 to SW8 has a first port and a second port, and allows one of the conduction and non-conduction states between the first and second ports to be selected. The A/D converters AD1 to AD8 have their respective inputs connected to the input ports IN1 to IN8. The A/D converters AD1 to AD8 convert the potentials at the respective output ports E11, E12, E21, E22, E31, E32, E41, and E42 to digital signals and output the resultant digital signals. The first ports of the switches SW1 to SW8 are connected to outputs of the A/D converters AD1 to AD8, respectively.

The arithmetic unit 30 further has four difference circuits 111, 112, 121, and 122. Each of the difference circuits 111, 112, 121, and 122 has first and second inputs and an output. The first input of the difference circuit 111 is connected to the second port of the switch SW1. The second input of the difference circuit 111 is connected to the second port of the switch SW2. The first input of the difference circuit 112 is connected to the second port of the switch SW3. The second input of the difference circuit 112 is connected to the second port of the switch SW4. The first input of the difference circuit 121 is connected to the second port of the switch SW5. The second input of the difference circuit 121 is connected to the second port of the switch SW6. The first input of the difference circuit 122 is connected to the second port of the switch SW7. The second input of the difference circuit 122 is connected to the second port of the switch SW8.

Each of the first to third arithmetic circuits 31 to 33 has first and second inputs and an output. The first input of the first arithmetic circuit 31 is connected to the output of the difference circuit 111. The second input of the first arithmetic circuit 31 is connected to the output of the difference circuit 121. The first input of the second arithmetic circuit 32 is connected to the output of the difference circuit 112. The second input of the second arithmetic circuit 32 is connected to the output of the difference circuit 122. The first input of the third arithmetic circuit 33 is connected to the output of the first arithmetic circuit 31. The second input of the third arithmetic circuit 33 is connected to the output of the second arithmetic circuit 32. The output of the third arithmetic circuit 33 is connected to the output port OUT1.

In a normal state, each of the switches SW1 to SW8 is in a conduction state. When in this state, the difference circuit 111 outputs a signal corresponding to the potential difference between the output ports E11 and E12 to the first arithmetic circuit 31. The difference circuit 112 outputs a signal corresponding to the potential difference between the output ports E21 and E22 to the second arithmetic circuit 32. The difference circuit 121 outputs a signal corresponding to the potential difference between the output ports E31 and E32 to the first arithmetic circuit 31. The difference circuit 122 outputs a signal corresponding to the potential difference between the output ports E41 and E42 to the second arithmetic circuit 32.

The arithmetic unit 30 has a fail-safe function. The arithmetic unit 30 includes a control unit 34 that controls the fail-safe function. The control unit 34 controls the switches SW1 to SW8. The control unit 34 can be implemented by a microcomputer, like the first to third arithmetic circuits 31 to 33. The fail-safe function will be described in detail later.

Now, a description will be given of the method of generating the first and second signals and the method of calculating the detected angle value θs in a normal state. In the example shown in FIG. 3, the directions of magnetization of the magnetization pinned layers of the MR elements in the second detection circuit 12 are ideally orthogonal to the directions of magnetization of the magnetization pinned layers of the MR elements in the first detection circuit 11. The output signal of the difference circuit 111 ideally has a sine waveform that depends on the first angle θ1, and the output signal of the difference circuit 112 ideally has a cosine waveform that depends on the first angle θ1. In this case, the output signal of the difference circuit 112 differs from the output signal of the difference circuit 111 in phase by ¼ the signal period T, i.e., by π/2 (90°).

When the first angle θ1 is greater than 0° and smaller than 180°, the output signal of the difference circuit 111 has a positive value. When the first angle θ1 is greater than 180° and smaller than 360°, the output signal of the difference circuit 111 has a negative value. When the first angle θ1 is equal to or greater than 0° and smaller than 90° and when the first angle θ1 is greater than 270° and smaller than or equal to 360°, the output signal of the difference circuit 112 has a positive value. When the first angle θ1 is greater than 90° and smaller than 270°, the output signal of the difference circuit 112 has a negative value. Hereinafter, the output signal of the difference circuit 111 will be denoted by sin θ1, and the output signal of the difference circuit 112 will be denoted by cos θ1. The output signal sin θ1 is a signal that indicates the intensity of the component of the rotating magnetic field MF in the first direction D1. The output signal cos θ1 is a signal that indicates the intensity of the component of the rotating magnetic field MF in the second direction D2.

In the example shown in FIG. 3, the directions of magnetization of the magnetization pinned layers of the MR elements in the fourth detection circuit 22 are ideally orthogonal to the directions of magnetization of the magnetization pinned layers of the MR elements in the third detection circuit 21. The output signal of the difference circuit 121 ideally has a sine waveform that depends on the second angle θ2, and the output signal of the difference circuit 122 ideally has a cosine waveform that depends on the second angle θ2. In this case, the output signal of the difference circuit 122 differs from the output signal of the difference circuit 121 in phase by ¼ the signal period T, i.e., by π/2 (90°).

When the second angle θ2 is greater than 0° and smaller than 180°, the output signal of the difference circuit 121 has a positive value. When the second angle θ2 is greater than 180° and smaller than 360°, the output signal of the difference circuit 121 has a negative value. When the second angle θ2 is equal to or greater than 0° and smaller than 90° and when the second angle θ2 is greater than 270° and smaller than or equal to 360°, the output signal of the difference circuit 122 has a positive value. When the second angle θ2 is greater than 90° and smaller than 270°, the output signal of the difference circuit 122 has a negative value. Hereinafter, the output signal of the difference circuit 121 will be denoted by sin θ2, and the output signal of the difference circuit 122 will be denoted by cos θ2. The output signal sin θ2 is a signal that indicates the intensity of the component of the rotating magnetic field MF in the third direction D3. The output signal cos θ2 is a signal that indicates the intensity of the component of the rotating magnetic field MF in the fourth direction D4.

Based on the output signal sin θ1 of the difference circuit 111 and the output signal sin θ2 of the difference circuit 121, the first arithmetic circuit 31 generates the first signal sin θs having a correspondence relationship with both the intensity of the component of the rotating magnetic field MF in the first direction D1 and the intensity of the component of the rotating magnetic field MF in the third direction D3. For example, the output signal sin θ1 and the output signal sin θ2 may be added into the first signal sin θs. In the present embodiment, the output signal sin θ1 and the output signal sin θ2 differ in phase by π/3 (60°). Let θ1 and θ2 be α−π/6 and α+π/6, respectively, and sin θ1 and sin θ2 be sin(α−π/6) and sin(α+π/6), respectively. Then the first signal sin θs is given by the equation (1) below.

$$\sin\theta s = \sin\theta 1 + \sin\theta 2 \qquad (1)$$
$$= \sin(\alpha - \pi/6) + \sin(\alpha + \pi/6)$$
$$= \sin\alpha \cdot \cos(-\pi/6) + \cos\alpha \cdot \sin(-\pi/6) +$$
$$\quad \sin\alpha \cdot \cos(\pi/6) + \cos\alpha \cdot \sin(\pi/6)$$
$$= 2\sin\alpha \cdot \cos(\pi/6)$$
$$= 1.73\sin\alpha$$

Based on the output signal cos θ1 of the difference circuit 112 and the output signal cos θ2 of the difference circuit 122, the second arithmetic circuit 32 generates the second signal cos θs having a correspondence relationship with both the intensity of the component of the rotating magnetic field MF in the second direction D2 and the intensity of the component of the rotating magnetic field MF in the fourth direction D4. For example, the output signal cos θ1 and the output signal cos θ2 may be added into the second signal cos θs. In the present embodiment, the output signal cos θ1 and the output signal cos θ2 differ in phase by π/3 (60°). As described above, let θ1 and θ2 be α−π/6 and α+π/6, respectively, and cos θ1 and cos θ2 be cos(α−π/6) and cos(α+π/6), respectively. Then the second signal cos θs is given by the equation (2) below.

$$\cos\theta s = \cos\theta 1 + \cos\theta 2 \qquad (2)$$
$$= \cos(\alpha - \pi/6) + \cos(\alpha + \pi/6)$$
$$= \cos\alpha \cdot \cos(-\pi/6) - \sin\alpha \cdot \sin(-\pi/6) +$$
$$\quad \cos\alpha \cdot \cos(\pi/6) - \sin\alpha \cdot \sin(\pi/6)$$
$$= 2\cos\alpha \cdot \cos(\pi/6)$$
$$= 1.73\cos\alpha$$

Based on the first signal sin θs and the second signal cos θs, the third arithmetic circuit 33 calculates the detected angle value θs having a correspondence relationship with the angle θ that the direction DM of the rotating magnetic field MF in the reference position PR forms with respect to the reference direction DR. Specifically, for example, the third arithmetic circuit 33 calculates θs by the equation (3) below. Note that "a tan" represents an arctangent.

$$\theta s = \operatorname{atan}(\sin\theta s / \cos\theta s) - \pi/6 \qquad (3)$$
$$= \operatorname{atan}(1.73\sin\alpha / 1.73\cos\alpha) - \pi/6$$

The term "a tan (1.73 sin α/1.73 cos α)" of the equation (3) represents the arctangent calculation for determining α. The relationship θs=α−π/6=θ1 is derived from the equation (3). Within the range of 360°, α in the equation (3) has two solutions with a difference of 180° in value. Which of the two solutions of α in the equation (3) is the true solution to α can be determined from the combination of positive and negative signs on sin θs and cos θs (that are equal to the positive and negative signs on sin α and cos α). More specifically, if sin θs is positive in value, α is greater than 0° and smaller than 180°. If sin θs is negative in value, α is greater than 180° and smaller than 360°. If cos θs is positive in value, α is equal to or greater than 0° and smaller than 90°, or is greater than 270° and smaller than or equal to 360°. If cos θs is negative in value, α is greater than 90° and smaller than 270°. The third arithmetic circuit 33 determines α within the range of 360°, using the equation (3) and based on the foregoing determination of the combination of positive and negative signs on sin θs and cos θs.

The fail-safe function of the arithmetic unit 30 will now be described in detail. The fail-safe function allows the arithmetic unit 30 to output the detected angle value θs even if any of the first to fourth detection circuits 11, 12, 21, and 22 is broken down. The operation of the fail-safe function, i.e., the operation of the control unit 34, will now be described with reference to FIG. 3. In a normal state, i.e., when all the first to fourth detection circuits 11, 12, 21, and 22 are normally operated, the control unit 34 brings each of the switches SW1 to SW8 shown in FIG. 3 into a conduction state. In this case, the arithmetic unit 30 calculates the detected angle value θs by the method that has been described with reference to the equations (1) to (3).

If one or both of the third and fourth detection circuits 21 and 22 are broken down, the control unit 34 brings each of the switches SW1 to SW4 into a conduction state and brings each of the switches SW5 to SW8 into a non-conduction state. In this case, only the output signal sin θ1 of the difference circuit 111 is supplied to the first arithmetic circuit 31, and only the output signal cos θ1 of the difference circuit 112 is supplied to the second arithmetic circuit 32. In this case, the first signal sin θs is equal to the output signal sin θ1, and the second signal cos θs is equal to the output signal cos θ1. Then the third arithmetic circuit 33 calculates θs using the equation (4) below.

$$\theta s = \operatorname{atan}(\sin\theta s / \cos\theta s) \quad (4)$$
$$= \operatorname{atan}(\sin\theta 1 / \cos\theta 1)$$
$$= \theta 1$$

The third arithmetic circuit 33 determines θ1 (θs) within the range of 360°, using the equation (4) and based on the determination of the combination of positive and negative signs on sin θ1 and cos θ1, as with the determination of α described above.

If one or both of the first and second detection circuits 11 and 12 are broken down, the control unit 34 brings each of the switches SW1 to SW4 into a non-conduction state and brings each of the switches SW5 to SW8 into a conduction state. In this case, only the output signal sin θ2 of the difference circuit 121 is supplied to the first arithmetic circuit 31, and only the output signal cos θ2 of the difference circuit 122 is supplied to the second arithmetic circuit 32. In this case, the first signal sin θs is equal to the output signal sin θ2, and the second signal cos θs is equal to the output signal cos θ2. Then the third arithmetic circuit 33 calculates θs using the equation (5) below.

$$\theta s = \operatorname{atan}(\sin\theta s / \cos\theta s) - \pi/3 \quad (5)$$
$$= \operatorname{atan}(\sin\theta 2 / \cos\theta 2) - \pi/3$$
$$= \theta 2 - \pi/3$$

The third arithmetic circuit 33 determines θ2 and θs within the range of 360°, using on the equation (5) and based on the determination of the combination of positive and negative signs on sin θ2 and cos θ2, as with the determination of α described above.

The control unit 34 determines the failure of each of the first to fourth detection circuits 11, 12, 21, and 22 in the following manner, for example. The control unit 34 monitors at least one of; the resistance value of the bridge circuit 14 shown in FIG. 3; the potentials at the output ports E11 and E12; and the output values of the A/D converters AD1 and AD2. The resistance value of the bridge circuit 14 is the resistance value between the power supply port V1 and the ground port G1. The control unit 34 determines whether or not the first detection circuit 11 is broken down on the basis of whether or not the value monitored by the control unit 34 falls within a preset normal value range, or whether or not the value monitored by the control unit 34 is an abnormal value. For example, assume that the control unit 34 monitors the potentials at the output ports E11 and E12. In this case, if the power supply voltage supplied to the power supply port V1 is 5 volts and the potentials at the output ports E11 and E12 are 0 volt or 5 volts, the control unit 34 determines that the potentials at the output ports E11 and E12 are abnormal in value, and thus determines that the first detection circuit 11 is broken down. The control unit 34 determines whether or not each of the other detection circuits 12, 21, and 22 is broken down by a method similar to the method of determining the failure of the first detection circuit 11.

The operation and effects of the rotating field sensor 1 will now be described with reference to FIG. 5 to FIG. 10. As previously described, the first arithmetic circuit 31 generates the first signal sin θs based on the output signals sin θ1 and sin θ2 of the difference circuits 111 and 121, which correspond to the output signals of the first and third detection circuits 11 and 21, and the second arithmetic circuit 32 generates the second signal cos θs based on the output signals cos θ1 and cos θ2 of the difference circuits 112 and 122, which correspond to the output signals of the second and fourth detection circuits 12 and 22. Based on the first signal sin θs and the second signal cos θs, the third arithmetic circuit 33 calculates the detected angle value θs having a correspondence relationship with the angle θ that the direction DM of the rotating magnetic field MF in the reference position PR forms with respect to the reference direction DR.

Figure 5:
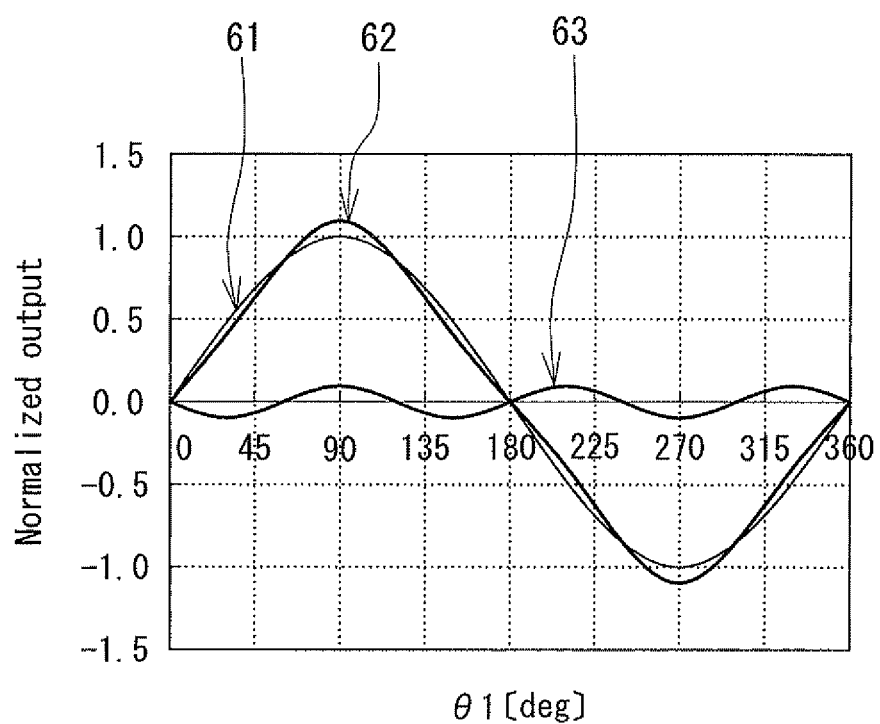
FIG. 5 is a waveform chart showing the waveforms of the output signal of a first detection circuit of the first embodiment and an error component included therein.
Figure 6:
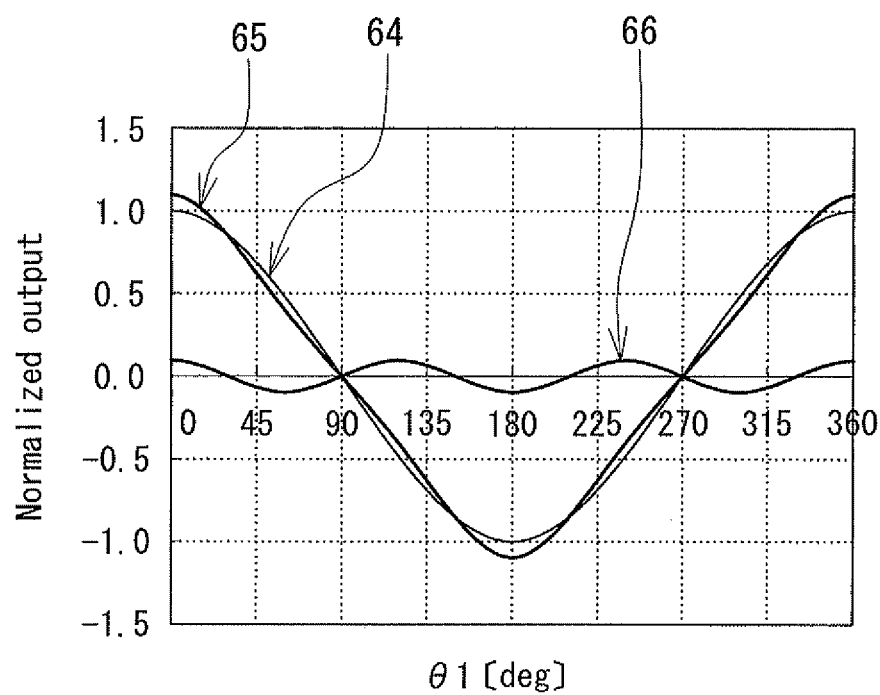
FIG. 6 is a waveform chart showing the waveforms of the output signal of a second detection circuit of the first embodiment and an error component included therein.

In the present embodiment, the output signals of the difference circuits 111, 112, 121, and 122 corresponding to the output signals (potential differences between the respective two output ports) of the detection circuits 11, 12, 21, and 22 ideally have sinusoidal waveforms (including a sine waveform and a cosine waveform). In actuality, however, distortion of the output signal waveforms of the MR elements occurring due to the MR elements themselves distorts the waveforms of the output signals of the difference circuits 111, 112, 121, and 122 from a sinusoidal curve. Examples of the situation where the output signal waveforms of the MR elements are distorted due to the MR elements themselves include: when the directions of magnetization of the magnetization pinned layers in the MR elements vary due to the influence of the rotating magnetic field MF or the like; and when the directions of magnetization of the free layers in the MR elements do not coincide with the direction of the rotating magnetic field MF due to the influence of such factors as the shape anisotropy and coercivity of the free layers. An output signal distorted from a sinusoidal curve includes not only an ideal sinusoidal component but also an error component. FIG. 5 and FIG. 6 show the waveforms of output signals distorted from a sinusoidal curve. FIG. 5 shows the waveform of the output signal sin θ1 of the difference circuit 111. FIG. 6 shows the waveform of the output signal cos θ1 of the difference circuit 112. In each of FIG. 5 and FIG. 6, the horizontal axis indicates the angle θ1, and the vertical axis indicates a normalized output. The normalized output is a value obtained by dividing the output signal at a given angle by the maximum value of the output signal. Reference numerals 61 and 64 each indicate an ideal sinusoidal curve. Reference numeral 62 indicates the waveform of the output signal sin θ1 that is distorted due to the MR elements. Reference numeral 63 indicates the waveform of the error component included in the output signal sin θ1. Reference numeral 65 indicates the waveform of the output signal cos θ1 that is distorted due to the MR elements. Reference numeral 66 indicates the waveform of the error component included in the output signal cos θ1. The waveforms shown in FIG. 5 and FIG. 6 were generated by simulation.

As shown in FIG. 5, the changes in the error component included in the output signal sin θ1 depend on the changes in the output signal sin θ1. As shown in FIG. 6, the changes in the error component included in the output signal cos θ1 depend on the changes in the output signal cos θ1. Likewise, the changes in the error component included in the output signal sin θ2 depend on the changes in the output signal sin θ2. The changes in the error component included in the output signal cos θ2 depend on the changes in the output signal cos θ2. When the output signals of the difference circuits are distorted in waveform as shown in FIG. 5 and FIG. 6, the error components included in the output signals of the difference circuits have a period of ⅓ the signal period T, i.e., 2π/3 (120°), as can be seen from the waveforms designated by reference numerals 63 and 66 in FIG. 5 and FIG. 6.

However, examples of distortion of the output signals of the difference circuits from a sinusoidal curve due to the MR elements are not limited to those shown in FIG. 5 and FIG. 6. In the examples shown in FIG. 5 and FIG. 6, the output signals of the difference circuits are each distorted from an ideal sinusoidal curve so as to come close to a triangular waveform. In contrast to the examples shown in FIG. 5 and FIG. 6, the output signals of the difference circuits may be distorted from an ideal sinusoidal curve so as to come close to a rectangular waveform. In such a case also, the output signals of the difference circuits include error components. In any case, the error components included in the output signals of the difference circuits have a period (hereinafter referred to as an error component period) of ⅓ the signal period T, i.e., 2π/3 (120°).

Figure 7:
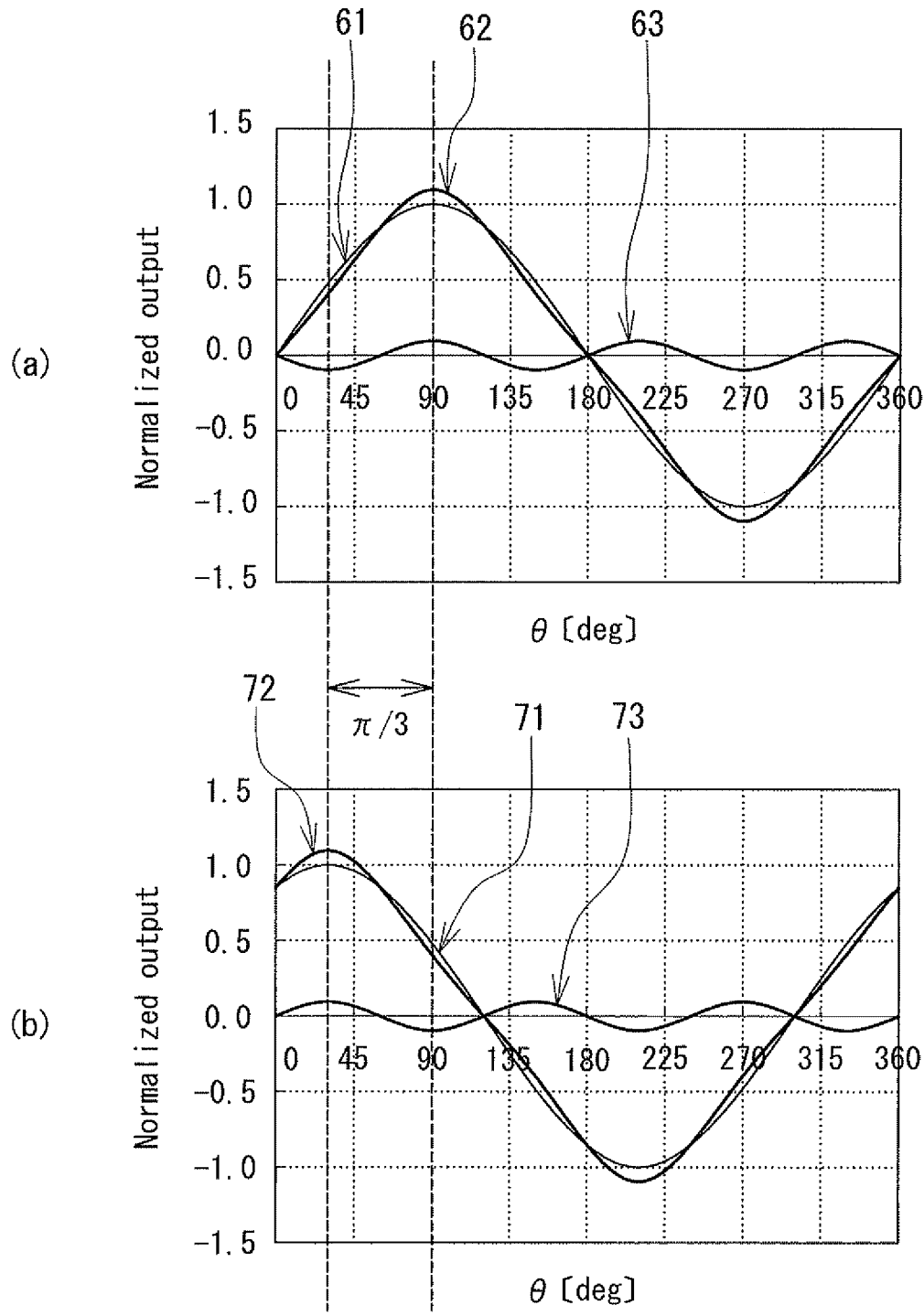
FIG. 7 is an explanatory diagram showing the cancellation of the error components included in the output signals of the first and third detection circuits of the first embodiment of the invention.

Based on the output signals sin θ1 and sin θ2, the first arithmetic circuit 31 generates the first signal sin θs having a correspondence relationship with both the intensity of the component of the rotating magnetic field MF in the first direction D1 and the intensity of the component of the rotating magnetic field MF in the third direction D3. The first signal sin θs includes a reduced error component as compared with the output signals sin θ1 and sin θ2. In the present embodiment, in particular, the output signal sin θ1 and the output signal sin θ2 differ in phase by ½ the error component period (⅙ the signal period T), i.e., by π/3 (60°). To achieve such a difference, the present embodiment is configured so that the first direction D1 and the third direction D3 differ by 60° in the direction of rotation of the rotating magnetic field MF. The present embodiment allows the error component included in the output signal sin θ1 and the error component included in the output signal sin θ2 to cancel each other out. This will be described with reference to FIG. 7. Portion (a) of FIG. 7 shows the waveform of the output signal sin θ1 of the difference circuit 111, shown in FIG. 5. Portion (b) of FIG. 7 shows the waveform of the output signal sin θ2 of the difference circuit 121. The horizontal axis in each of portions (a) and (b) of FIG. 7 indicates the angle θ. Reference numeral 71 indicates an ideal sinusoidal curve. Reference numeral 72 indicates the waveform of the output signal sin θ2 that is distorted due to the MR elements. Reference numeral 73 indicates the waveform of the error component included in the output signal sin θ2. In the present embodiment, the output signal sin θ1 and the output signal sin θ2 are added into the first signal sin θs. Therefore, when the first signal sin θs is generated, the error component included in the output signal sin θ1 and the error component included in the output signal sin θ2 are in opposite phases. Consequently, the error components included in the output signals sin θ1 and sin θ2 cancel each other out.

Figure 8:
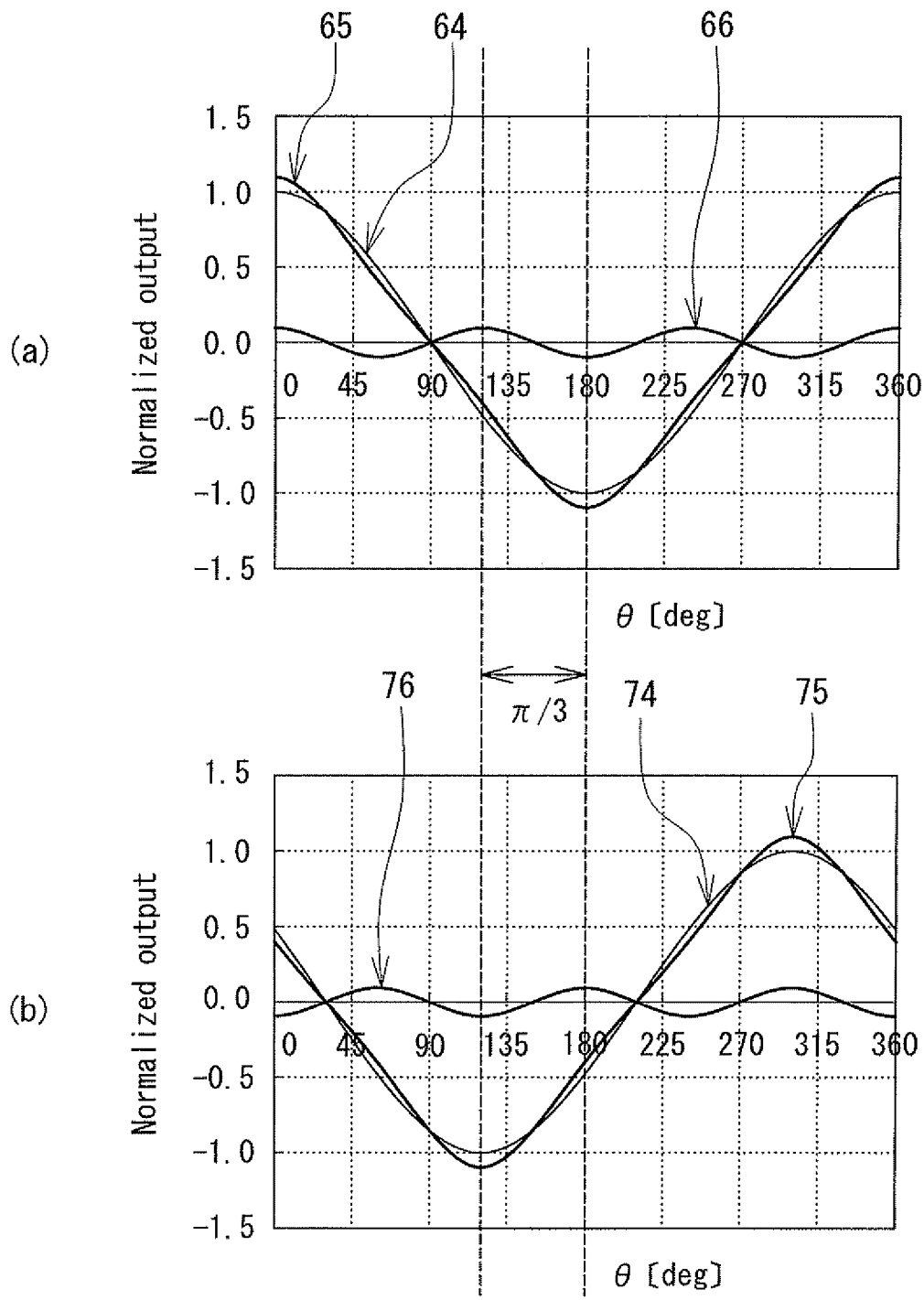
FIG. 8 is an explanatory diagram showing the cancellation of the error components included in the output signals of the second and fourth detection circuits of the first embodiment of the invention.

Based on the output signals cos θ1 and cos θ2, the second arithmetic circuit 32 generates the second signal cos θs having a correspondence relationship with both the intensity of the component of the rotating magnetic field MF in the second direction D2 and the intensity of the component of the rotating magnetic field MF in the fourth direction D4. The second signal cos θs includes a reduced error component as compared with the output signals cos θ1 and cos θ2. In the present embodiment, in particular, the output signal cos θ1 and the output signal cos θ2 differ in phase by ½ the error component period (⅙ the signal period T), i.e., by π/3 (60°). The present embodiment allows the error component included in the output signal cos θ1 and the error component included in the output signal cos θ2 to cancel each other out, as with the error components included in the output signals sin θ1 and sin θ2. This will be described with reference to FIG. 8. Portion (a) of FIG. 8 shows the waveform of the output signal cos θ1 of the difference circuit 112, shown in FIG. 6. Portion (b) of FIG. 8 shows the waveform of the output signal cos θ2 of the difference circuit 122. The horizontal axis in each of portions (a) and (b) of FIG. 8 indicates the angle θ. Reference numeral 74 indicates an ideal sinusoidal curve. Reference numeral 75 indicates the waveform of the output signal cos θ2 that is distorted due to the MR elements. Reference numeral 76 indicates the waveform of the error component included in the output signal cos θ2. In the present embodiment, the output signal cos θ1 and the output signal cos θ2 are added into the second signal cos θs. Therefore, when the second signal cos θs is generated, the error component included in the output signal cos θ1 and the error component included in the output signal cos θ2 are in opposite phases. Consequently, the error components included in the output signals cos θ1 and cos θ2 cancel each other out.

Figure 9:
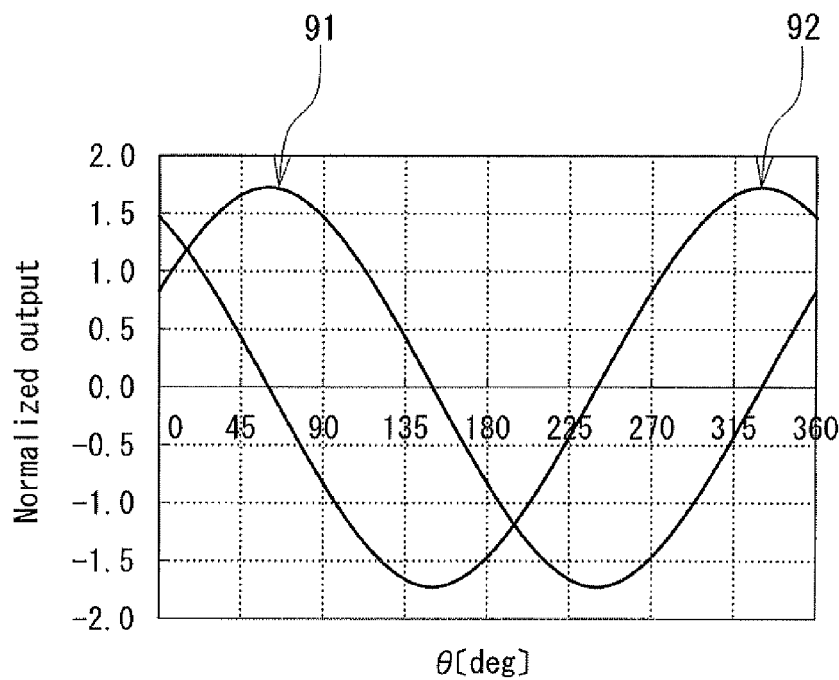
FIG. 9 is a waveform chart showing the waveforms of first and second signals of the first embodiment of the invention.

FIG. 9 shows the waveform of the first signal sin θs (designated by reference numeral 91) obtained by adding together the output signal sin θ1 and the output signal sin θ2 shown in FIG. 7, and the waveform of the second signal cos θs (designated by reference numeral 92) obtained by adding together the output signal cos θ1 and the output signal cos θ2 shown in FIG. 8. The horizontal axis in FIG. 9 indicates the angle θ. As shown in FIG. 9, because of the cancellation of the error components included in the output signals sin θ1 and sin θ2, the waveform of the first signal sin θs traces a sinusoidal curve with reduced distortion, i.e., with a reduced error component. Likewise, because of the cancellation of the error components included in the output signals cos θ1 and cos θ2, the waveform of the second signal cos θs traces a sinusoidal curve with reduced distortion, i.e., with a reduced error component.

Figure 10:
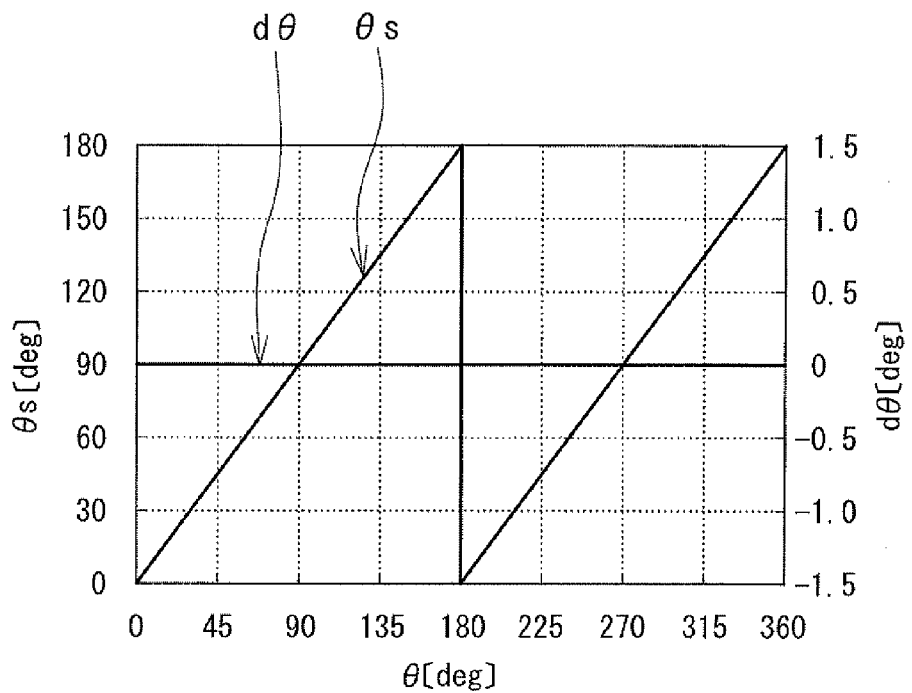
FIG. 10 is a waveform chart showing a detected angle value and an angular error in the first embodiment of the invention.

FIG. 10 shows the waveforms of the detected angle value θs calculated based on the first signal sin θs and the second signal cos θs shown in FIG. 9, and an angular error included in the detected angle value θs. The angular error is an error with respect to a theoretical value of the detected angle value θs that is expected when the direction DM of the rotating magnetic field MF rotates ideally. In FIG. 10, the angular error is designated by symbol dθ. In FIG. 10, the horizontal axis indicates the angle θ, and the vertical axis indicates the detected angle value θs and the angular error dθ. For the sake of convenience, FIG. 10 shows θs on the vertical axis in values after a subtraction of 180° if the actual angle is in the range of 180° to 360°. As shown in FIG. 10, the angular error dθ is 0 in simulation. Actual measurement results will be shown later to demonstrate that the present embodiment enables reduction of the angular error dθ.

As has been described, even when the output signals of the MR elements are distorted in waveform due to the MR elements themselves, it is possible according to the present embodiment to reduce the error in the detected angle value θs caused by the MR elements.

In the present embodiment, the phase difference between the output signals sin θ1 and sin θ2 is not limited to ½ the error component period (⅙ the signal period T), and may be any odd number of times ½ the error component period (⅙ the signal period T) (other than an integer multiple of ½ the signal period T). In such cases, the error component included in the output signal sin θ1 and the error component included in the output signal sin θ2 cancel each other out when the first signal sin θs is generated by adding together the output signal sin θ1 and the output signal sin θ2. This allows reducing the error in the detected angle value θs. Likewise, the phase difference between the output signals cos θ1 and cos θ2 is not limited to ½ the error component period (⅙ the signal period T), and may be any odd number of times ½ the error component period (⅙ the signal period T) (other than an integer multiple of ½ the signal period T). In such cases, the error component included in the output signal cos θ1 and the error component included in the output signal cos θ2 cancel each other out when the second signal cos θs is generated by adding together the output signal cos θ1 and the output signal cos θ2. This allows reducing the error in the detected angle value θs.

In the present embodiment, the first position P1 and the second position P2 are identical with each other in the direction of rotation of the rotating magnetic field MF. In this case, the first direction D1 and the third direction D3 may be different from each other in the direction of rotation of the rotating magnetic field MF by a spatial angle equivalent to an odd number of times ½ the error component period (⅙ the signal period T) (other than an integer multiple of ½ the signal period T). This allows the output signals sin θ1 and sin θ2 to differ in phase by an odd number of times ½ the error component period (⅙ the signal period T) (other than an integer multiple of ½ the signal period T). In the example shown in FIG. 2, the first direction D1 and the third direction D3 are different from each other in the direction of rotation of the rotating magnetic field MF by a spatial angle equivalent to ½ the error component period (⅙ the signal period T), i.e., by 60°.

The phase difference between the output signals sin θ1 and sin θ2 is not limited to an odd number of times ½ the error component period (⅙ the signal period T), and may be any even number of times ½ the error component period (⅙ the signal period T) (other than an integer multiple of ½ the signal period T). In such cases, the error component included in the output signal sin θ1 and the error component included in the output signal sin θ2 are in the same phase when the first signal sin θs is generated. In this case, for example, the output signal sin θ2 is subtracted from the output signal sin θ1, and the resultant is used as the first signal sin θs. This allows the error component included in the output signal sin θ1 and the error component included in the output signal sin θ2 to cancel each other out. Likewise, the phase difference between the output signals cos θ1 and cos θ2 is not limited to an odd number of times ½ the error component period (⅙ the signal period T), and may be any even number of times ½ the error component period (⅙ the signal period T) (other than an integer multiple of ½ the signal period T). In such cases, the error component included in the output signal cos θ1 and the error component included in the output signal cos θ2 are in the same phase when the second signal cos θs is generated. In this case, for example, the output signal cos θ2 is subtracted from the output signal cos θ1, and the resultant is used as the second signal cos θs. This allows the error component included in the output signal cos θ1 and the error component included in the output signal cos θ2 to cancel each other out.

Preferably, each of the phase difference between the output signals sin θ1 and sin θ2 and the phase difference between the output signals cos θ1 and cos θ2 is an integer multiple of ⅙ the signal period T other than an integer multiple of ½ the signal period T. However, the phase difference between the output signals sin θ1 and sin θ2 and the phase difference between the output signals cos θ1 and cos θ2 may each be different from an integer multiple of ⅙ the signal period T other than an integer multiple of ½ the signal period T, so long as the error component with a period of ⅓ the signal period T is reduced in the first signal sin θs as compared with that in each of the output signals sin θ1 and sin θ2 and also the error component with a period of ⅓ the signal period T is reduced in the second signal cos θs as compared with that in each of the output signals cos θ1 and cos θ2.

In the present embodiment, the detected angle value is determined by using the two detection units 10 and 20 that have the same configuration except for the directions of magnetization of the magnetization pinned layers of the MR elements. Therefore, even if the error components included in the respective output signals of the difference circuits vary as a function of temperature, it is possible to cancel out the error components, which include fluctuations due to temperature, in the output signals of the difference circuits when determining the detected angle value. Consequently, according to the present embodiment, it is eventually possible to obtain the detected angle value with less temperature-based error variations.

The effects of the rotating field sensor 1 according to the present embodiment will now be described in more detail in comparison with rotating field sensors of first and second comparative examples. If a rotating field sensor includes only the first detection unit 10 and does not include the second detection unit 20, the detected angle value θs is calculated by a method similar to the method that has been described with reference to the equation (4). In such a case, because the output signal waveforms of the MR elements are distorted due to the MR elements themselves, the detected angle value θs may include an angular error with respect to the theoretical value of the detected angle value θs that is expected when the direction of the rotating magnetic field rotates ideally. The angular error changes periodically in response to a change of the direction of the rotating magnetic field, and the change of the angular error depends on a change of the detected angle value θs.

Figure 11:
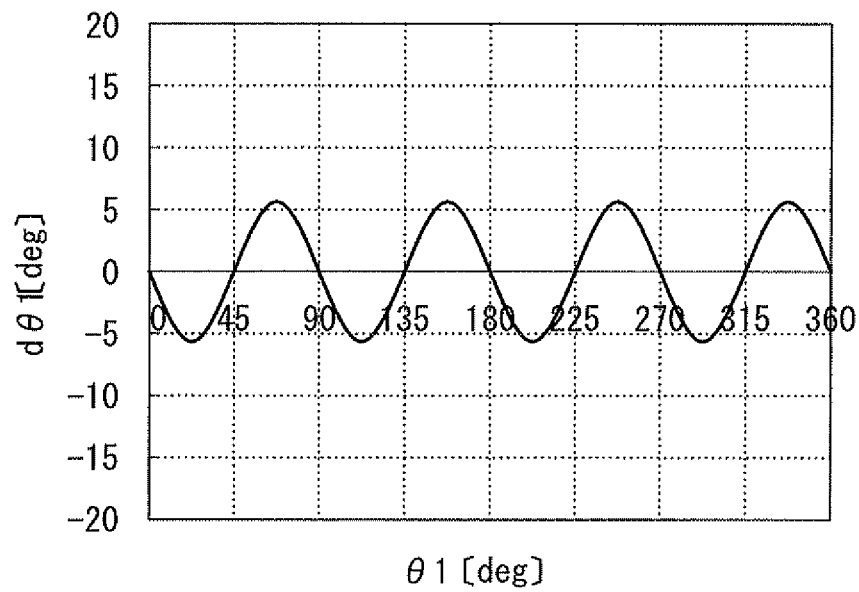
FIG. 11 is a waveform chart showing the waveform of an angular error included in a detected angle value that is calculated based on the waveforms of the output signals shown in FIG. 5 and FIG. 6.

FIG. 11 shows an angular error dθ1 included in the detected angle value θs calculated using the equation (4) based on the waveform of the output signal sin θ1 shown in FIG. 5 and the waveform of the output signal cos θ1 shown in FIG. 6. In FIG. 11, the horizontal axis indicates the angle θ1, and the vertical axis indicates the angular error dθ1. As shown in FIG. 11, when the output signals of the difference circuits 111 and 112 are distorted in waveform as shown in FIG. 5 and FIG. 6, the angular error dθ1 has a period of ¼ the signal period T, i.e., π/2 (90°).

Figure 12:
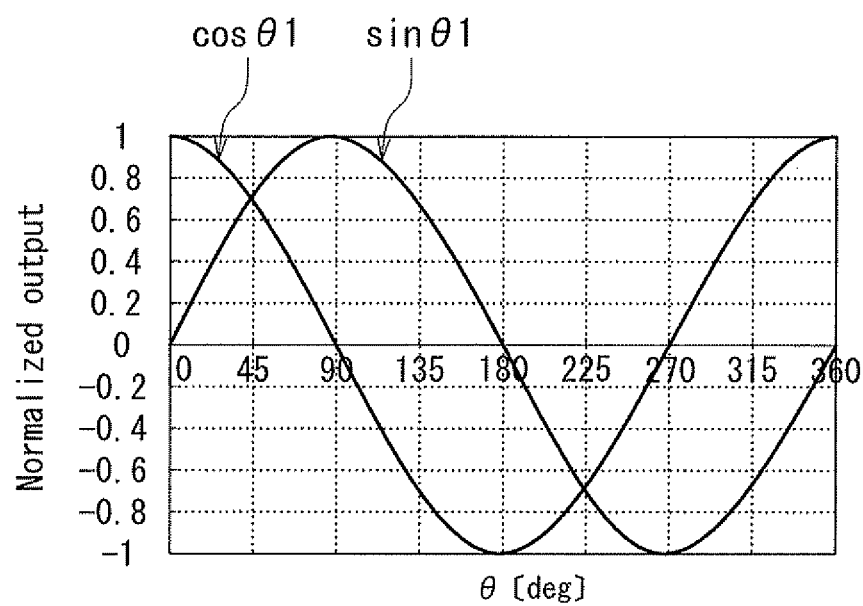
FIG. 12 is a waveform chart showing the waveforms of the output signals of the first and second detection circuits of the first embodiment of the invention.
Figure 13:
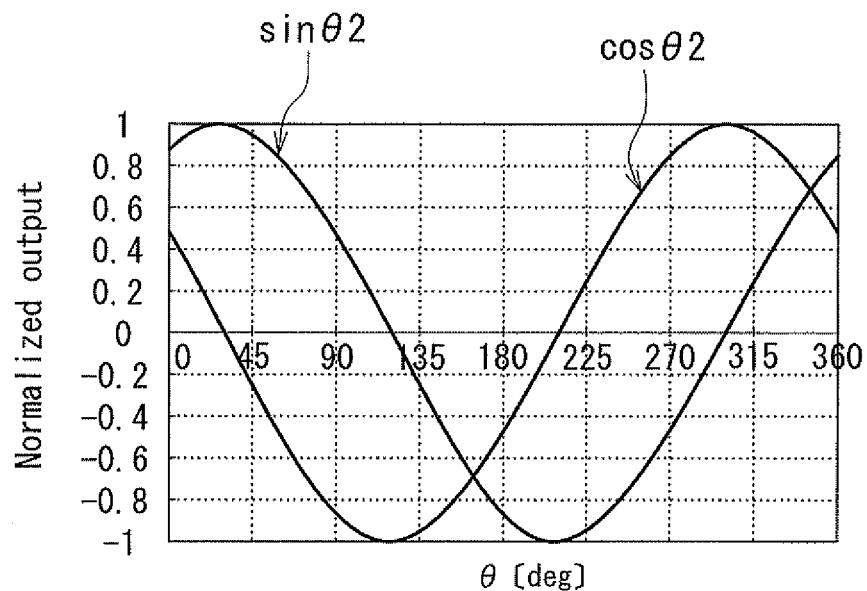
FIG. 13 is a waveform chart showing the waveforms of the output signals of the third and fourth detection circuits of the first embodiment of the invention.
Figure 14:
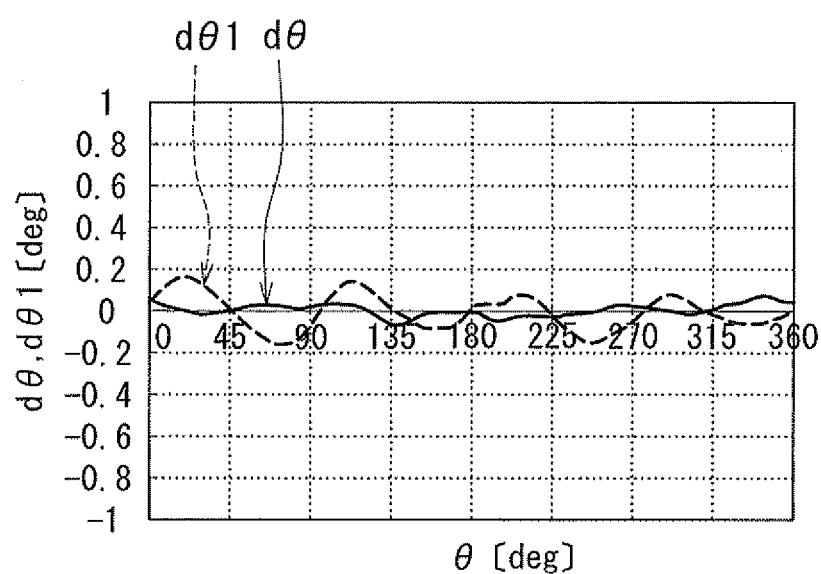
FIG. 14 is a waveform chart showing the waveform of an angular error in the first embodiment and the waveform of an angular error in a rotating field sensor of a first comparative example.

Reference is now made to FIG. 12 to FIG. 14 to describe the results of comparison between the angular error in a rotating field sensor including only the first detection unit 10 and not including the second detection unit 20 (hereinafter referred to as a rotating field sensor of the first comparative example) and the angular error in the rotating field sensor 1 according to the present embodiment. FIG. 12 shows the actually measured values of the output signals sin θ1 and cos θ1 of the difference circuits 111 and 112. In FIG. 12, the horizontal axis indicates the angle θ, and the vertical axis indicates the normalized output. FIG. 13 shows the actually measured values of the output signals sin θ2 and cos θ2 of the difference circuits 121 and 122. In FIG. 13, the horizontal axis indicates the angle θ, and the vertical axis indicates the normalized output.

The rotating field sensor of the first comparative example has the same configuration as that of the rotating field sensor 1 shown in FIG. 3 except the absence of the second detection unit 20. The rotating field sensor of the first comparative example calculates the detected angle value θs based on the output signals sin θ1 and cos θ1 shown in FIG. 12, by using the equation (4). The rotating field sensor 1 according to the present embodiment generates the first signal sin θs based on the output signal sin θ1 shown in FIG. 12 and the output signal sin θ2 shown in FIG. 13 by using the equation (1), and generates the second signal cos θs based on the output signal cos θ1 shown in FIG. 12 and the output signal cos θ2 shown in FIG. 13 by using the equation (2). Then, the sensor 1 calculates the detected angle value θs based on the first signal sin θs and the second signal cos θs by using the equation (3).

FIG. 14 shows the respective angular errors included in the detected angle values θs calculated as described above. In FIG. 14, symbol dθ1 represents the angular error included in the detected angle value θs obtained by the rotating field sensor of the first comparative example, and symbol dθ represents the angular error included in the detected angle value θs obtained by the rotating field sensor 1 according to the present embodiment. In FIG. 14, the horizontal axis indicates the angle θ, and the vertical axis indicates the angular errors dθ and dθ1. As shown in FIG. 14, the angular error dθ is smaller than the angular error dθ1. In the example shown in FIG. 14, the angular error dθ1 has an amplitude of ±0.16°, and the angular error dθ has an amplitude of ±0.07°.

The rotating field sensor according to the present embodiment thus achieves a reduced angular error dθ included in the detected angle value θs, as compared with a rotating field sensor that includes only the first detection unit 10 and does not include the second detection unit 20.

When the detected angle value θs is calculated based on the output signals sin θ1 and cos θ1, the angular error dθ1 included in the detected angle value θs has a period of π/2 (90°), as shown in FIG. 11 and FIG. 14. Here, the use of a rotating field sensor of a second comparative example described below can reduce the angular error.

The rotating field sensor of the second comparative example has first and second detection units, as does the rotating field sensor 1 according to the present embodiment. The first detection unit includes two detection circuits that are the same as the first and second detection circuits 11 and 12 in configuration, and a first arithmetic circuit that calculates a first detected angle value based on the output signals of these detection circuits. The first detected angle value has a correspondence relationship with the angle that the direction of the rotating magnetic field in the reference position forms with respect to the reference direction. The first arithmetic circuit calculates the first detected angle value by a method similar to the method that has been described with reference to the equation (4). The first detected angle value includes a first angular error resulting from the MR elements. The first angular error has a period of π/2 (90°).

The second detection unit includes two detection circuits that are the same as the third and fourth detection circuits 21 and 22 in configuration, and a second arithmetic circuit that calculates a second detected angle value based on the output signals of these detection circuits. The second detected angle value has a correspondence relationship with the angle that the direction of the rotating magnetic field in the reference position forms with respect to the reference direction. The second arithmetic circuit calculates the second detected angle value by a method similar to the method that has been described with reference to the equation (4). The second detected angle value includes a second angular error resulting from the MR elements. The second angular error has a period of π/2 (90°).

The rotating field sensor of the second comparative example further has a third arithmetic circuit that calculates, based on the first detected angle value and the second detected angle value, a detected value of the angle that the direction of the rotating magnetic field in the reference position forms with respect to the reference direction. The rotating field sensor of the second comparative example is configured so that the first detected angle value and the second detected angle value differ in phase by ½ the period of the first and second angular errors, i.e., by π/4 (45°). Accordingly, when the detected value is calculated by the third arithmetic circuit, the first angular error and the second angular error are in opposite phases. It is therefore possible to cancel out the first angular error and the second angular error by adding the first detected angle value and the second detected angle value when calculating the detected value.

Figure 15:
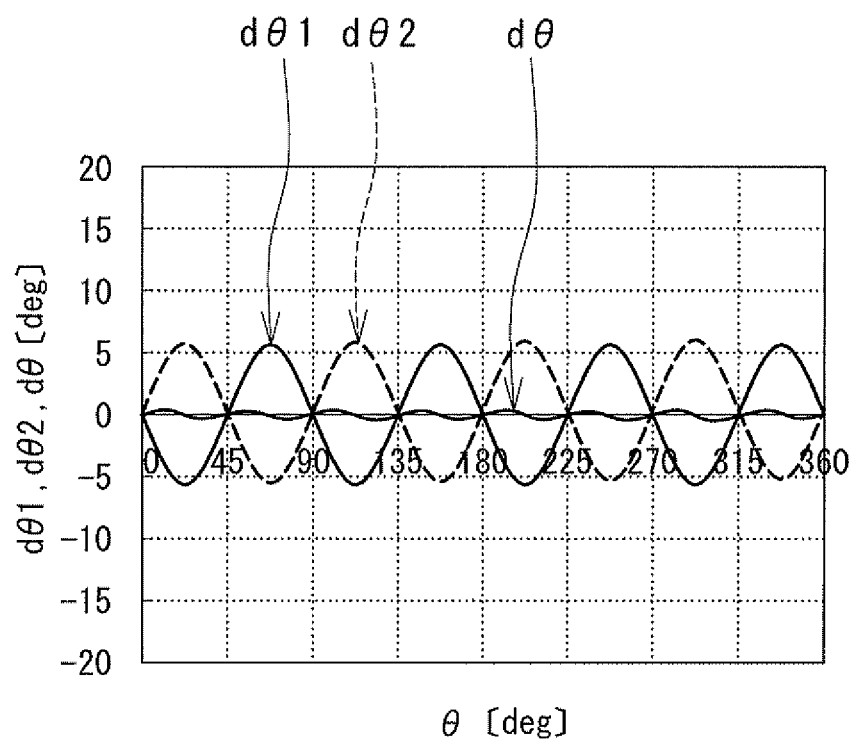
FIG. 15 is a waveform chart showing the waveforms of angular errors in a rotating field sensor of a second comparative example against the first embodiment.

FIG. 15 shows the first and second angular errors and the angular error included in the detected value calculated as described above. In FIG. 15, symbol dθ1 represents the first angular error, symbol dθ2 represents the second angular error, and symbol dθ represents the angular error included in the detected value. In FIG. 15, symbol θ represents the angle that the direction of the rotating magnetic field in the reference position forms with respect to the reference direction. In FIG. 15, the horizontal axis indicates the angle θ, and the vertical axis indicates dθ1, dθ2, and dθ. As shown in FIG. 15, the angular error dθ is smaller than both the first angular error dθ1 and the second angular error dθ2.

In the rotating field sensor of the second comparative example, the first arithmetic circuit calculates the first detected angle value, and the second arithmetic circuit calculates the second detected angle value. To calculate the first and second detected angle values, as already described, the arithmetic operation including the arctangent calculation in the equation (4) and the determination of the combination of positive and negative signs of two output signals must be performed twice. Such an arithmetic operation for calculating the first and second detected angle values is relatively complicated and requires a long processing time. The second comparative example thus has the drawbacks of increasing the cost of the microcomputer that performs the arithmetic operation, and being susceptible to deterioration of the accuracy of the rotating field sensor due to the long processing time.

In contrast, according to the present embodiment, the first arithmetic circuit 31 generates the first signal sin θs, the second arithmetic circuit 32 generates the second signal cos θs, and the third arithmetic circuit 33 calculates the detected angle value θs based on the first signal sin θs and the second signal cos θs. The arithmetic operation performed by each of the first and second arithmetic circuits 31 and 32 is addition or subtraction, and is simpler than an arithmetic operation that includes arctangent calculation. In the present embodiment, an arithmetic operation including arctangent calculation is performed only once by the third arithmetic circuit 33. Therefore, the arithmetic operation for calculating the detected angle value in the present embodiment is simpler than that in the second comparative example. Consequently, according to the present embodiment, it is possible to reduce the cost of the microcomputer for performing the arithmetic operation and to prevent the rotating field sensor from being degraded in accuracy due to a long processing time.

[Modification Examples]

Figure 16:
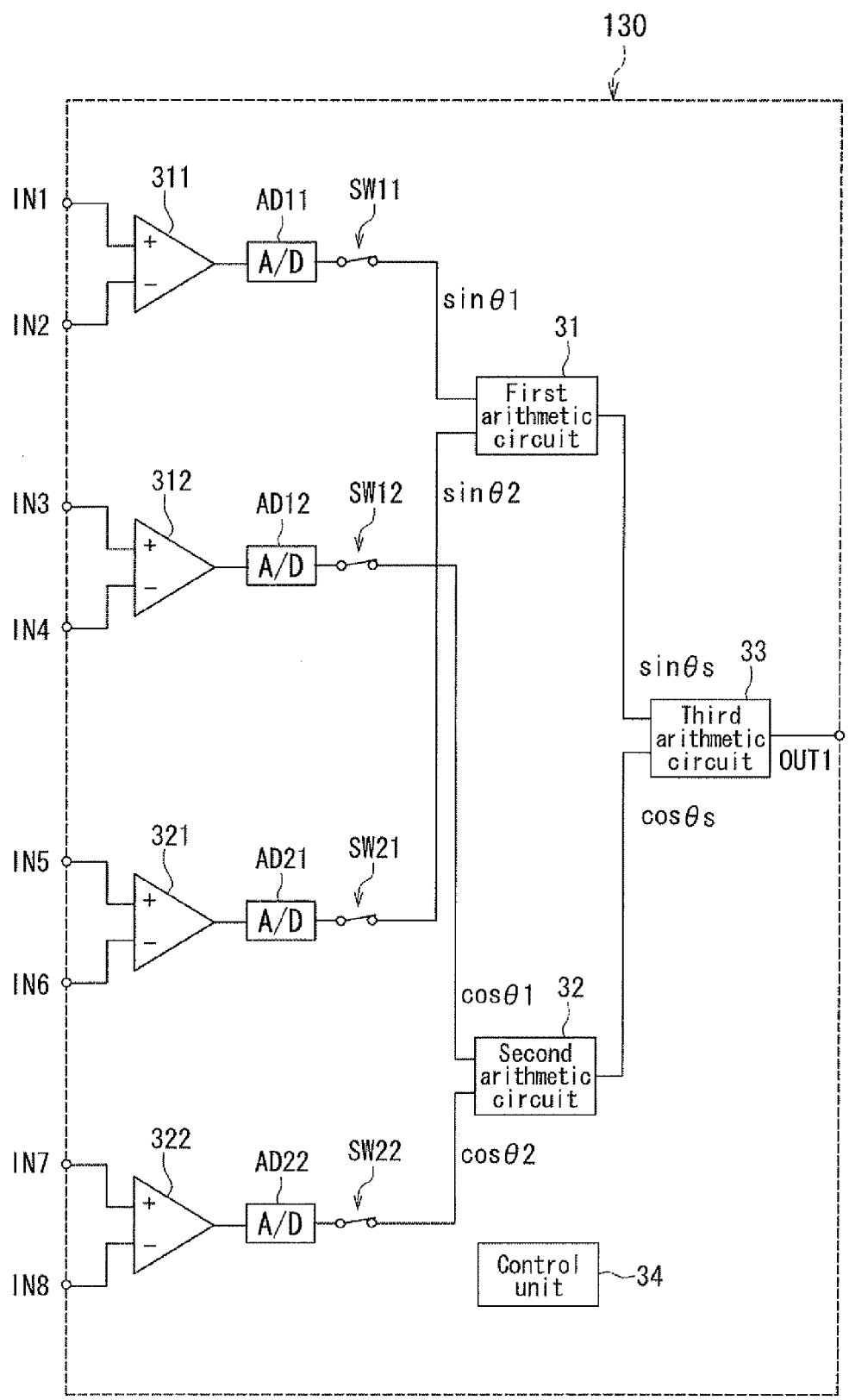
FIG. 16 is a circuit diagram showing an arithmetic unit in a first modification example of the first embodiment.
Figure 17:
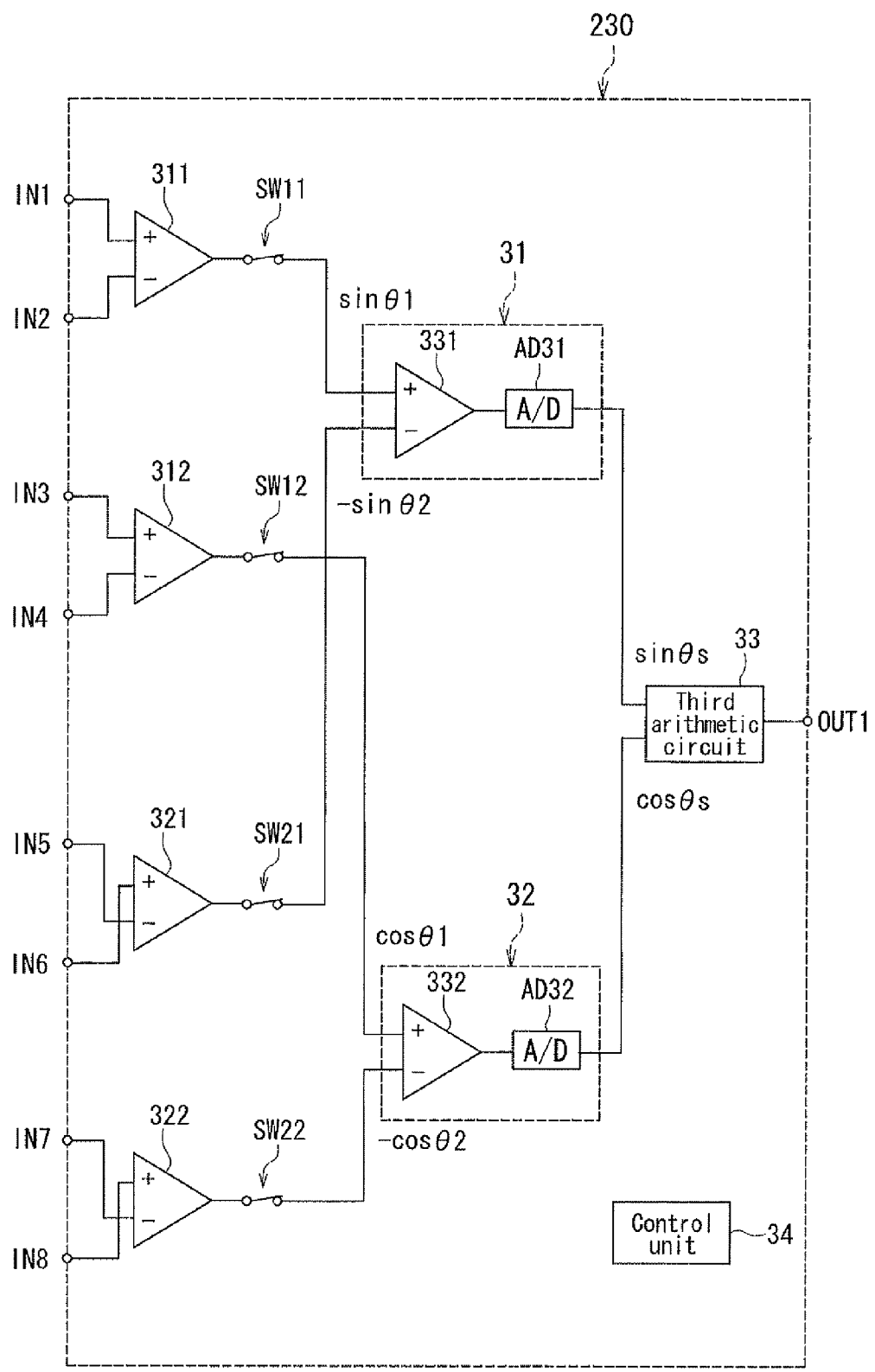
FIG. 17 is a circuit diagram showing an arithmetic unit in a second modification example of the first embodiment.
Figure 18:
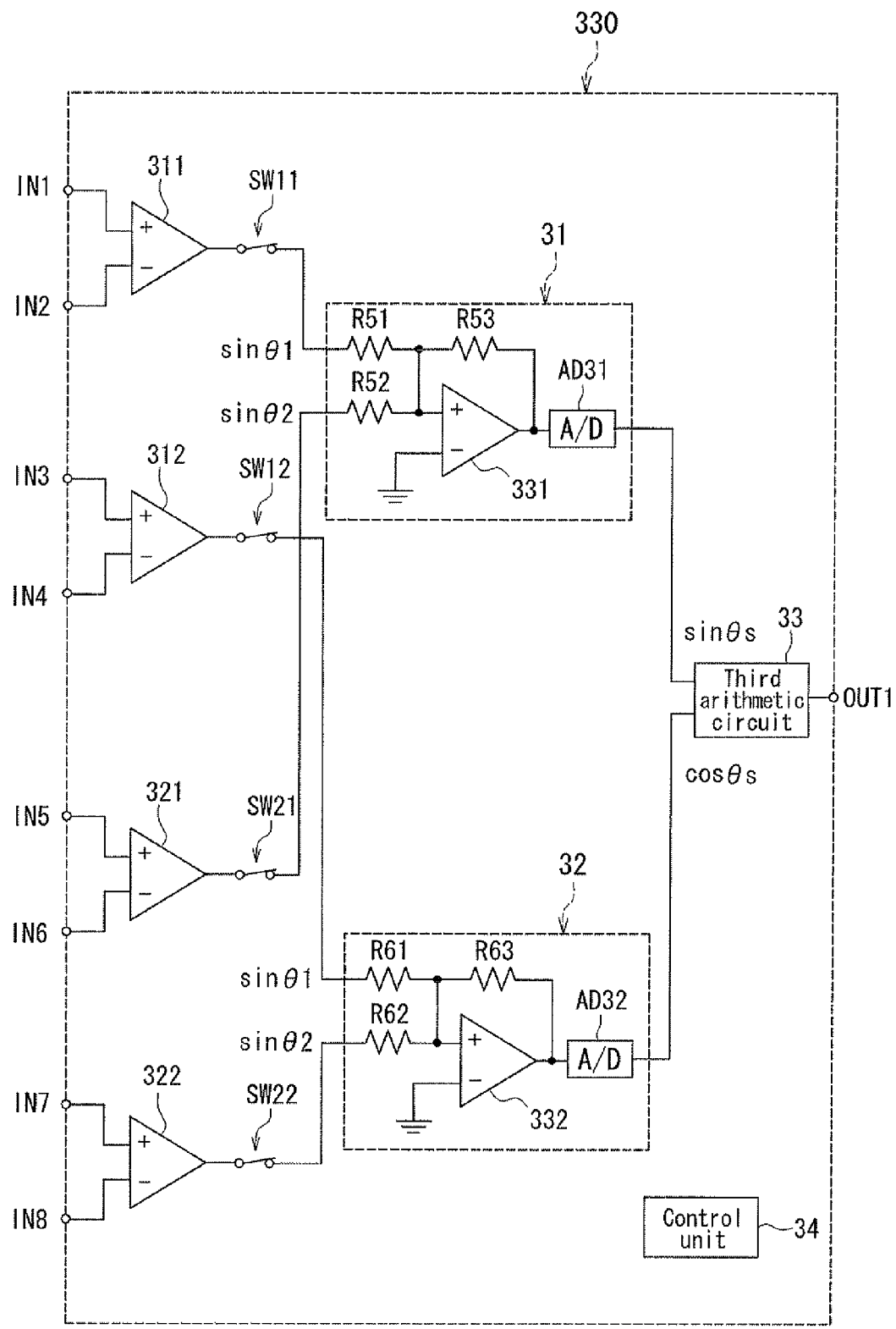
FIG. 18 is a circuit diagram showing an arithmetic unit in a third modification example of the first embodiment.

Reference is now made to FIG. 16 to FIG. 18 to describe first to third modification examples of the present embodiment. The first modification example will be described first, with reference to FIG. 16. FIG. 16 is a circuit diagram showing the arithmetic unit of the first modification example. The rotating field sensor of the first modification example has the arithmetic unit 130 shown in FIG. 16, instead of the arithmetic unit 30 shown in FIG. 3. The remainder of the configuration of the rotating field sensor of the first modification example is the same as that of the rotating field sensor 1 shown in FIG. 3.

Like the arithmetic unit 30 shown in FIG. 3, the arithmetic unit 130 has first to third arithmetic circuits 31, 32, and 33, a control unit 34, input ports IN1 to IN8, and an output port OUT1. The arithmetic unit 130 further has A/D converters AD11, AD12, AD21, and AD22, switches SW11, SW12, SW21, and SW22, and difference detectors (difference amplifiers) 311, 312, 321, and 322, instead of the A/D converters AD1 to AD8, the switches SW1 to SW8, and the difference circuits 111, 112, 121, and 122 of the arithmetic unit 30 shown in FIG. 3. Each of the switches SW11, SW12, SW21, and SW22 has a first port and a second port, and allows one of the conduction and non-conduction states between the first and second ports to be selected. Each of the difference detectors 311, 312, 321, and 322 has first and second inputs and an output.

The first and second inputs of the difference detector 311 are connected to the input ports IN1 and IN2, respectively. The first and second inputs of the difference detector 312 are connected to the input ports IN3 and IN4, respectively. The first and second inputs of the difference detector 321 are connected to the input ports IN5 and IN6, respectively. The first and second inputs of the difference detector 322 are connected to the input ports IN7 and IN8, respectively. The inputs of the AD converters AD11, AD12, AD21, and AD22 are connected to the outputs of the difference detectors 311, 312, 321, and 322, respectively. The first ports of the switches SW11, SW12, SW21, and SW22 are connected to the outputs of the AD converters AD11, AD12, AD21, and AD22, respectively.

The difference detector 311 outputs a signal corresponding to the potential difference between the output ports E11 and E12 shown in FIG. 3. The A/D converter AD11 converts the signal output from the difference detector 311 to a digital signal and outputs the resultant digital signal. The difference detector 312 outputs a signal corresponding to the potential difference between the output ports E21 and E22 shown in FIG. 3. The A/D converter AD12 converts the signal output from the difference detector 312 to a digital signal and outputs the resultant digital signal. The difference detector 321 outputs a signal corresponding to the potential difference between the output ports E31 and E32 shown in FIG. 3. The A/D converter AD21 converts the signal output from the difference detector 321 to a digital signal and outputs the resultant digital signal. The difference detector 322 outputs a signal corresponding to the potential difference between the output ports E41 and E42 shown in FIG. 3. The A/D converter AD22 converts the signal output from the difference detector 322 to a digital signal and outputs the resultant digital signal. Ideally, the output signals of the A/D converters AD11 and AD21 have sine waveforms that depend on the angles θ1 and θ2, respectively. Ideally, the output signals of the A/D converters AD12 and AD22 have cosine waveforms that depend on the angles θ1 and θ2, respectively. Hereinafter, the output signals of the A/D converters AD11, AD12, AD21, and AD22 will be designated by sin θ1, cos θ1, sin θ2, and cos θ2, respectively.

In the first modification example, the first input of the first arithmetic circuit 31 is connected to the second port of the switch SW11. The second input of the first arithmetic circuit 31 is connected to the second port of the switch SW21. The first input of the second arithmetic circuit 32 is connected to the second port of the switch SW12. The second input of the second arithmetic circuit 32 is connected to the second port of the switch SW22.

In a normal state, each of the switches SW11, SW12, SW21, and SW22 is in a conduction state. When in this state, the A/D converter AD11 outputs a signal (sin θ1) corresponding to the potential difference between the output ports E11 and E12 to the first arithmetic circuit 31. The A/D converter AD12 outputs a signal (cos θ1) corresponding to the potential difference between the output ports E21 and E22 to the second arithmetic circuit 32. The A/D converter AD21 outputs a signal (sin θ2) corresponding to the potential difference between the output ports E31 and E32 to the first arithmetic circuit 31. The A/D converter AD22 outputs a signal (cos θ2) corresponding to the potential difference between the output ports E41 and E42 to the second arithmetic circuit 32.

In the first modification example, in a normal state, i.e., when all the first to fourth detection circuits 11, 12, 21, and 22 shown in FIG. 3 are normally operated, the control unit 34 brings each of the switches SW11, SW12, SW21, and SW22 into a conduction state. If one or both of the third and fourth detection circuits 21 and 22 shown in FIG. 3 are broken down, the control unit 34 brings each of the switches SW11 and SW12 into a conduction state and brings each of the switches SW21 and SW22 into a non-conduction state. If one or both of the first and second detection circuits 11 and 12 shown in FIG. 3 are broken down, the control unit 34 brings each of the switches SW11 and SW12 into a non-conduction state and brings each of the switches 21 and 22 into a conduction state.

In the first modification example, the control unit 34 determines the failure of each of the first to fourth detection circuits 11, 12, 21, and 22 shown in FIG. 3 in the following manner, for example. The control unit 34 monitors at least one of: the resistance value of the bridge circuit 14 shown in FIG. 3; the potentials at the output ports E11 and E12; the output value of the difference detector 311; and the output value of the A/D converter AD 11, and thereby determines whether or not the first detection circuit 11 is broken down. The control unit 34 determines whether or not each of the other detection circuits 12, 21, and 22 is broken down by a method similar to the method of determining the failure of the first detection circuit 11.

Next, the second modification example of the present embodiment will be described with reference to FIG. 17. FIG. 17 is a circuit diagram showing the arithmetic unit of the second modification example. The rotating field sensor of the second modification example has the arithmetic unit 230 shown in FIG. 17, instead of the arithmetic unit 30 shown in FIG. 3. The remainder of the configuration of the rotating field sensor of the second modification example is the same as that of the rotating field sensor 1 shown in FIG. 3.

Like the arithmetic unit 130 shown in FIG. 16, the arithmetic unit 230 has first to third arithmetic circuits 31, 32, and 33, a control unit 34, input ports IN1 to IN8, an output port OUT1, switches SW11, SW12, SW21, and SW22, and difference detectors 311, 312, 321, and 322. The arithmetic unit 230 does not have the A/D converters AD11, AD12, AD21, and AD22 provided in the arithmetic unit 130 shown in FIG. 16.

In the second modification example, the first and second inputs of the difference detector 311 are connected to the input ports IN1 and IN2, respectively. The first and second inputs of the difference detector 312 are connected to the input ports IN3 and IN4, respectively. The first and second inputs of the difference detector 321 are connected to the input ports IN6 and IN5, respectively. The first and second inputs of the difference detector 322 are connected to the input ports IN8 and IN7, respectively. The first ports of the switches SW11, SW12, SW21, and SW22 are connected to the outputs of the difference detectors 311, 312, 321, and 322, respectively.

The difference detector 311 outputs a signal corresponding to the potential difference between the output ports E11 and E12 shown in FIG. 3. The difference detector 312 outputs a signal corresponding to the potential difference between the output ports E21 and E22 shown in FIG. 3. The difference detector 321 outputs a signal corresponding to the potential difference between the output ports E31 and E32 shown in FIG. 3. This signal has a sign opposite to the sign of the signal output from the difference detector 321 of the first modification example. The difference detector 322 outputs a signal corresponding to the potential difference between the output ports E41 and E42 shown in FIG. 3. This signal has a sign opposite to the sign of the signal output from the difference detector 322 of the first modification example. Hereinafter, the output signals of the difference detectors 311, 312, 321, and 322 will be designated by sin θ1, cos θ1, −sin θ2, and −cos θ2, respectively.

In the second modification example, the first arithmetic circuit 31 includes a difference detector 331 and an A/D converter AD31. The difference detector 331 has first and second inputs and an output. The first input of the difference detector 331 is connected to the second port of the switch SW11. The second input of the difference detector 331 is connected to the second port of the switch SW21. The input of the A/D converter AD31 is connected to the output of the difference detector 331. The first input of the third arithmetic circuit 33 is connected to the output of the A/D converter AD31. In a normal state, each of the switches SW11 and SW21 is in a conduction state. When in this state, the difference detector 311 outputs a signal (sin θ1) corresponding to the potential difference between the output ports E11 and E12 to the difference detector 331. The difference detector 321 outputs a signal (−sin θ2) corresponding to the potential difference between the output ports E31 and E32 to the difference detector 331. The difference detector 331 outputs a signal (sin θ1+sin θ2) obtained by subtracting the output signal of the difference detector 321 from the output signal of the difference detector 311. The A/D converter AD31 converts the signal output from the difference detector 331 to a digital signal and outputs the resultant digital signal.

In the second modification example, the second arithmetic circuit 32 includes a difference detector 332 and an A/D converter AD 32. The difference detector 332 has first and second inputs and an output. The first input of the difference detector 332 is connected to the second port of the switch SW12. The second input of the difference detector 332 is connected to the second port of the switch SW22. The input of the A/D converter AD32 is connected to the output of the difference detector 332. The second input of the third arithmetic circuit 33 is connected to the output of the A/D converter AD32. In a normal state, each of the switches SW12 and SW22 is in a conduction state. When in this state, the difference detector 312 outputs a signal (cos θ1) corresponding to the potential difference between the output ports E21 and E22 to the difference detector 332. The difference detector 322 outputs a signal (−cos θ2) corresponding to the potential difference between the output ports E41 and E42 to the difference detector 332. The difference detector 332 outputs a signal (cos θ1+cos θ2) obtained by subtracting the output signal of the difference detector 322 from the output signal of the difference detector 312. The A/D converter AD32 converts the signal output from the difference detector 332 to a digital signal and outputs the resultant digital signal.

In the second modification example, the control unit 34 determines the failure of each of the first to fourth detection circuits 11, 12, 21, and 22 shown in FIG. 3 in the following manner, for example. The control unit 34 monitors at least one of the resistance value of the bridge circuit 14 shown in FIG. 3; the potentials at the output ports E11 and E12; the output value of the difference detector 311; the output value of the difference detector 331; and the output value of the A/D converter AD31, and thereby determines whether or not the first detection circuit 11 is broken down. The control unit 34 determines whether or not each of the other detection circuits 12, 21, and 22 is broken down by a method similar to the method of determining the failure of the first detection circuit 11.

Next, the third modification example of the present embodiment will be described with reference to FIG. 18. FIG. 18 is a circuit diagram showing the arithmetic unit of the third modification example. The rotating field sensor of the third modification example has the arithmetic unit 330 shown in FIG. 18, instead of the arithmetic unit 30 shown in FIG. 3. The remainder of the configuration of the rotating field sensor of the third modification example is the same as that of the rotating field sensor 1 shown in FIG. 3.

Like the arithmetic unit 230 shown in FIG. 17, the arithmetic unit 330 has first to third arithmetic circuits 31, 32, and 33, a control unit 34, input ports IN1 to IN8, an output port OUT1, switches SW11, SW12, SW21, and SW22, and difference detectors 311, 312, 321, and 322. The same input ports as in the first modification example shown in FIG. 16 are connected to the respective inputs of the difference detectors 311, 312, 321, and 322. The first arithmetic circuit 31 includes a difference detector 331, an A/D converter AD31, and three resistors R51, R52, and R53. The second arithmetic circuit 32 includes a difference detector 332, an A/D converter AD32, and three resistors R61, R62, and R63.

In the third modification example, the second ports of the switches SW11 and SW21 are connected to the first input of the difference detector 331 via the resistors R51 and R52. The output of the difference detector 331 is connected to the first input of the difference detector 331 via the resistor R53. The second input of the difference detector 331 is connected to the ground. In a normal state, each of the switches SW11 and SW21 is in a conduction state. When in this state, the difference detector 311 outputs a signal (sin θ1) corresponding to the potential difference between the output ports E11 and E12 to the difference detector 331. The difference detector 321 outputs a signal (sin θ2) corresponding to the potential difference between the output ports E31 and E32 to the difference detector 331. The difference detector 331 outputs a signal (sin θ1+sin θ2) obtained by adding together the output signal of the difference detector 311 and the output signal of the difference detector 321.

In the third modification example, the second ports of the switches SW12 and SW22 are connected to the first input of the difference detector 332 via the resistors R61 and R62. The output of the difference detector 332 is connected to the first input of the difference detector 332 via the resistor R63. The second input of the difference detector 332 is connected to the ground. In a normal state, each of the switches SW12 and SW22 is in a conduction state. When in this state, the difference detector 312 outputs a signal (cos θ1) corresponding to the potential difference between the output ports E21 and E22 to the difference detector 332. The difference detector 322 outputs a signal (cos θ2) corresponding to the potential difference between the output ports E41 and E42 to the difference detector 332. The difference detector 332 outputs a signal (cos θ1+cos θ2) obtained by adding together the output signal of the difference detector 312 and the output signal of the difference detector 322.

In the third modification example, the control unit 34 determines the failure of each of the first to fourth detection circuits 11, 12, 21, and 22 shown in FIG. 3 by, for example, the same method as that in the second modification example.

[Second Embodiment]

Figure 19:
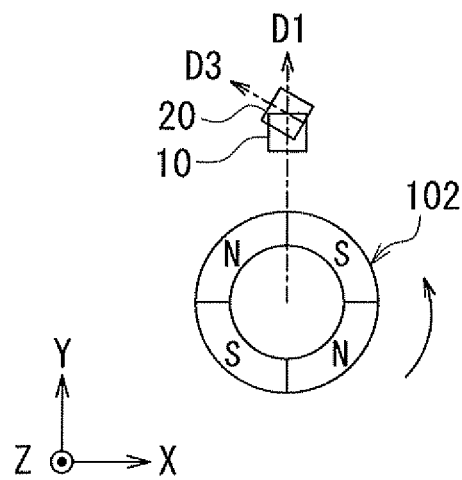
FIG. 19 is an explanatory diagram showing the configuration of a rotating field sensor according to a second embodiment of the invention.

A rotating field sensor according to a second embodiment of the invention will now be described with reference to FIG. 19. FIG. 19 is an explanatory diagram showing the configuration of the rotating field sensor according to the present embodiment. In FIG. 19, a magnet 102 including one or more pairs of N and S poles alternately arranged in a ring shape is shown as an example of the means for generating a rotating magnetic field whose direction rotates. In the example shown in FIG. 19, the magnet 102 includes two pairs of N and S poles. The rotating field sensor 1 according to the present embodiment detects the direction of the rotating magnetic field generated from the outer periphery of the magnet 102. In the example shown in FIG. 19, the plane of the drawing of FIG. 19 is an XY plane, and the direction perpendicular to the plane is the Z direction. The N and S poles of the magnet 102 are arranged symmetrically with respect to the center of rotation parallel to the Z direction. The magnet 102 rotates about the center of rotation. As a result, a rotating magnetic field occurs based on the magnetic field generated by the magnet 102. The rotating magnetic field rotates about the center of rotation (the Z direction). In the example shown in FIG. 19, the magnet 102 rotates in a counterclockwise direction, and the rotating magnetic field rotates in a clockwise direction.

In the example shown in FIG. 19, the first direction D1 representing the direction of one component of the rotating magnetic field detected by the first detection unit 10 is set to a radial direction of the magnet 102. The third direction D3 representing the direction of one component of the rotating magnetic field detected by the second detection unit 20 is set to a direction rotated from the first direction D1 by −60° in the direction of rotation of the rotating magnetic field in the XY plane. Therefore, the first direction D1 and the third direction D3 differ from each other by 60° in the direction of rotation of the rotating magnetic field. The third direction D3 may be set to a direction rotated from the first direction D1 by 60° in the direction of rotation of the rotating magnetic field in the XY plane.

The first direction D1 and a second direction (not shown), which represents the direction of another component of the rotating magnetic field detected by the first detection unit 10, are in the same relationship as that between the first direction D1 and the second direction D2 in the first embodiment shown in FIG. 2. Similarly, the third direction D3 and a fourth direction (not shown), which represents the direction of another component of the rotating magnetic field detected by the second detection unit 20, are in the same relationship as that between the third direction D3 and the fourth direction D4 in the first embodiment shown in FIG. 2. Instead of the first direction D1, the second direction may be set to the radial direction of the magnet 102. In this case, the fourth direction is a direction rotated from the second direction by −60° in the direction of rotation of the rotating magnetic field in the XY plane.

[Modification Examples]

Figure 20:
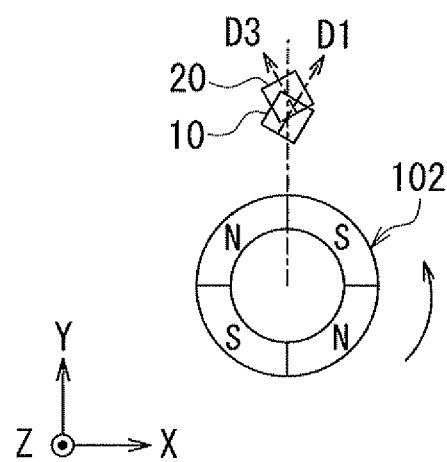
FIG. 20 is an explanatory diagram showing the configuration of a rotating field sensor of a first modification example of the second embodiment of the invention.
Figure 21:
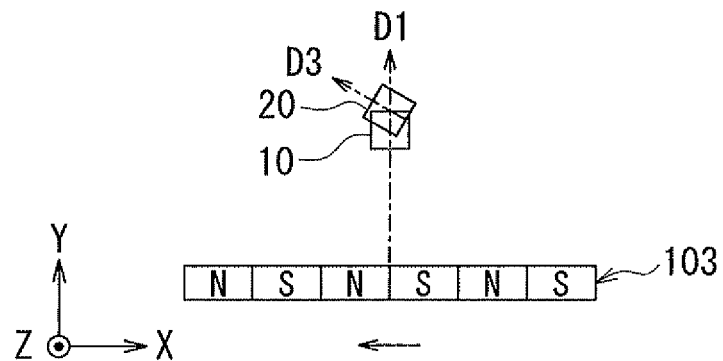
FIG. 21 is an explanatory diagram showing the configuration of a rotating field sensor of a second modification example of the second embodiment of the invention.
Figure 22:
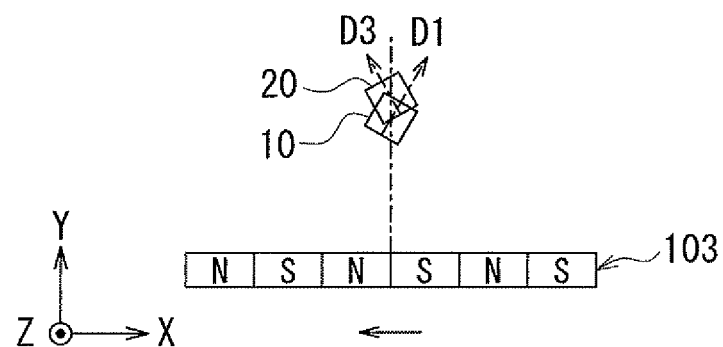
FIG. 22 is an explanatory diagram showing the configuration of a rotating field sensor of a third modification example of the second embodiment of the invention.

Reference is now made to FIG. 20 to FIG. 22 to describe first to third modification examples of the present embodiment. The first modification example will be described first, with reference to FIG. 20. FIG. 20 is an explanatory diagram showing the configuration of a rotating field sensor of the first modification example of the present embodiment. The configuration of the rotating field sensor 1 of the first modification example is basically the same as that of the rotating field sensor shown in FIG. 19. In the example shown in FIG. 20, the first direction D1 and the third direction D3 differ from each other by 60° in the direction of rotation of the rotating magnetic field, and are both tilted with respect to the radial direction of the magnet 102 in the XY plane. Preferably, the angles that the first direction D1 and the third direction D3 form with respect to the radial direction of the magnet 102 are equal in absolute value, and more specifically, 30° and −30° (the direction in which the rotating magnetic field rotates shall be positive). Such a configuration allows the positional relationship between the detection unit 10 and the rotating magnetic field and the positional relationship between the detection unit 20 and the rotating magnetic field to be the same, thereby eliminating the need for a correction that would be required when those positional relationships are different.

Next, the second modification example of the present embodiment will be described with reference to FIG. 21. FIG. 21 is an explanatory diagram showing the configuration of a rotating field sensor of the second modification example. In FIG. 21, a magnet 103 including a plurality of pairs of N and S poles alternately arranged in a line is shown as an example of the means for generating a rotating magnetic field whose direction rotates. The rotating field sensor 1 of the second modification example detects the direction of the rotating magnetic field generated from the outer periphery of the magnet 103. In the example shown in FIG. 21, the plane of the drawing of FIG. 21 is an XY plane, and the direction perpendicular to the plane is the Z direction. The magnet 103 makes a straight movement in its longitudinal direction along with a straight movement of an object. As a result, a rotating magnetic field occurs based on the magnetic field generated by the magnet 103. The rotating magnetic field rotates about the Z direction.

In the example shown in FIG. 21, the first direction D1 is set to a direction orthogonal to the direction of movement of the magnet 103 in the XY plane. The third direction D3 is a direction that is rotated from the first direction D1 by −60° in the direction of rotation of the rotating magnetic field in the XY plane. Therefore, the first direction D1 and the third direction D3 differ from each other by 60° in the direction of rotation of the rotating magnetic field.

Next, the third modification example of the present embodiment will be described with reference to FIG. 22. FIG. 22 is an explanatory diagram showing the configuration of a rotating field sensor of the third modification example. The configuration of the rotating field sensor 1 of the third modification example is basically the same as that of the rotating field sensor 1 shown in FIG. 21. In the example shown in FIG. 22, the first direction D1 and the third direction D3 differ from each other by 60° in the direction of rotation of the rotating magnetic field, and are both tilted with respect to the direction orthogonal to the direction of movement of the magnet 103 in the XY plane. Preferably, as in the first modification example, the angles that the first direction D1 and the third direction D3 form with respect to the direction orthogonal to the direction of movement of the magnet 103 are equal in absolute value, and more specifically, 30° and −30° (the direction in which the rotating magnetic field rotates shall be positive).

The other configuration, operation, and effects of the present embodiment are the same as those of the first embodiment.

[Third Embodiment]

Figure 23:
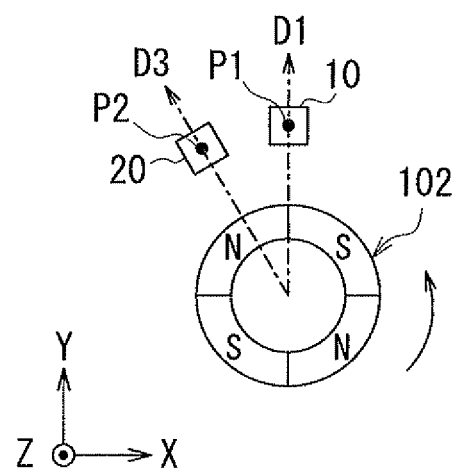
FIG. 23 is an explanatory diagram showing the configuration of a rotating field sensor according to a third embodiment of the invention.

A rotating field sensor according to a third embodiment of the invention will now be described with reference to FIG. 23. FIG. 23 is an explanatory diagram showing the configuration of the rotating field sensor according to the present embodiment. The rotating field sensor 1 according to the present embodiment detects the direction of the rotating magnetic field generated from the outer periphery of the magnet 102, as in the examples of the second embodiment shown in FIG. 19 and FIG. 20. In the rotating field sensor 1 according to the present embodiment, the first position P1 in which the first detection unit 10 detects the rotating magnetic field and the second position P2 in which the second detection unit 20 detects the rotating magnetic field are different from each other. More specifically, in the present embodiment, the first detection unit 10 and the second detection unit 20 are located in different positions. The difference between the first position P1 and the second position P2 is equivalent to an integer multiple of 1/6 the signal period T other than an integer multiple of 1/2 the signal period T.

In the example shown in FIG. 23, the magnet 102 includes two pairs of N and S poles, and one rotation of the magnet 102 produces two rotations of the rotating magnetic field. In this case, one period of the output signals of the difference circuits 111, 112, 121, and 122 shown in FIG. 3 in the first embodiment, i.e., an electrical angle of 360°, is equivalent to a one-half rotation of the magnet 102, i.e., an angle of rotation of 180° of the magnet 102. The error components included in the output signals of the difference circuits have a period (an error component period) of 1/3 the signal period T. This error component period is equivalent to 120° in electrical angle and to 60° in the angle of rotation of the magnet 102. In the present embodiment, the difference between the first position P1 and the second position P2 is equivalent to an integer multiple of 1/6 the signal period T, i.e., an integer multiple of 1/2 the error component period (60° in electrical angle) (other than an integer multiple of 1/2 the signal period T). FIG. 23 shows an example where the difference between the first position P1 and the second position P2 is equivalent to an integer multiple of 30° in the angle of rotation of the magnet 102 (other than an integer multiple of 90° in the angle of rotation of the magnet 102). In the particular example shown in FIG. 23, the first position P1 and the second position P2 differ from each other by 30° in the angle of rotation of the magnet 102.

In the example shown in FIG. 23, the first direction D1 representing the direction of one component of the rotating magnetic field detected by the first detection unit 10 and the third direction D3 representing the direction of one component of the rotating magnetic field detected by the second detection unit 20 are both set to radial directions of the magnet 102. The first direction D1 and a second direction (not shown), which represents the direction of another component of the rotating magnetic field detected by the first detection unit 10, are in the same relationship as that between the first direction D1 and the second direction D2 in the first embodiment shown in FIG. 2. Similarly, the third direction D3 and a fourth direction (not shown), which represents the direction of another component of the rotating magnetic field detected by the second detection unit 20, are in the same relationship as that between the third direction D3 and the fourth direction D4 in the first embodiment shown in FIG. 2. Consequently, the phase difference between the output signal sin θ1 indicating the intensity of the component of the rotating magnetic field in the first direction D1 at the first position P1 and the output signal sin θ2 indicating the intensity of the component of the rotating magnetic field in the third direction D3 at the second position P2, and the phase difference between the output signal cos θ1 indicating the intensity of the component of the rotating magnetic field in the second direction at the first position P1 and the output signal cos θ2 indicating the intensity of the component of the magnetic field in the fourth direction at the second position P2, are both equivalent to an integer multiple of 1/6 the signal period T, i.e., an integer multiple of 1/2 the error component period (60° in electrical angle) (other than an integer multiple of 1/2 the signal period T).

Instead of the first direction D1 and the third direction D3, the second direction and the fourth direction may be set to radial directions of the magnet 102.

In the present embodiment, as in the first embodiment, the output signals sin θ1 and sin θ2 differ in phase by an integer multiple of 1/2 the error component period. Therefore, the error component included in the output signal sin θ1 and that included in the output signal sin θ2 cancel each other out when the first signal sin θs is generated. In the present embodiment, as in the first embodiment, the output signals cos θ1 and cos θ2 differ in phase by an integer multiple of 1/2 the error component period. Therefore, the error component included in the output signal cos θ1 and that included in the output signal cos θ2 cancel each other out when the second signal cos θs is generated. Consequently, according to the present embodiment, it is possible to reduce the error in the detected angle value θs.

[Modification Example]

Figure 24:
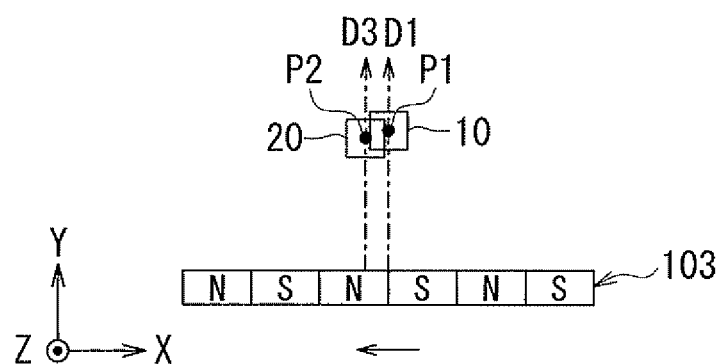
FIG. 24 is an explanatory diagram showing the configuration of a rotating field sensor of a modification example of the third embodiment of the invention.

Reference is now made to FIG. 24 to describe a rotating field sensor of a modification example of the present embodiment. FIG. 24 is an explanatory diagram showing the configuration of the rotating field sensor of the modification example. The rotating field sensor 1 of the modification example detects the direction of the rotating magnetic field generated from the outer periphery of the magnet 103, as in the examples of the second embodiment shown in FIG. 21 and FIG. 22. In the example shown in FIG. 24, while the magnet 103 moves by one pitch, i.e., as much as a pair of N and S poles, the rotating magnetic field makes one rotation. In this case, one period of the output signals of the difference circuits 111, 112, 121, and 122, i.e., an electrical angle of 360°, is equivalent to one pitch of the magnet 103. The error components included in the output signals have a period (an error component period) of ⅓ the signal period T. This error component period is equivalent to a one-third pitch. In the present embodiment, the difference between the first position P1 and the second position P2 is equivalent to an integer multiple of ⅙ the signal period T, i.e., an integer multiple of ½ the error component period (60° in electrical angle) (other than an integer multiple of ½ the signal period T). FIG. 24 shows an example where the difference between the first position P1 and the second position P2 is equivalent to an integer multiple of a one-sixth pitch of the magnet 103 (other than an integer multiple of a one-half pitch of the magnet 103). In the particular example shown in FIG. 24, the first position P1 and the second position P2 differ from each other by a one-sixth pitch.

In the example shown in FIG. 24, both the first direction D1 and the third direction D3 are set to a direction orthogonal to the direction of movement of the magnet 103 in the XY plane. Consequently, both the phase difference between the output signals sin θ1 and sin θ2 and the phase difference between the output signals cos θ1 and cos θ2 are equivalent to an integer multiple of ⅙ the signal period T, i.e., an integer multiple of ½ the error component period (60° in electrical angle) (other than an integer multiple of ½ the signal period T).

The other configuration, operation, and effects of the present embodiment are the same as those of the second embodiment.

[Fourth Embodiment]

Figure 25:
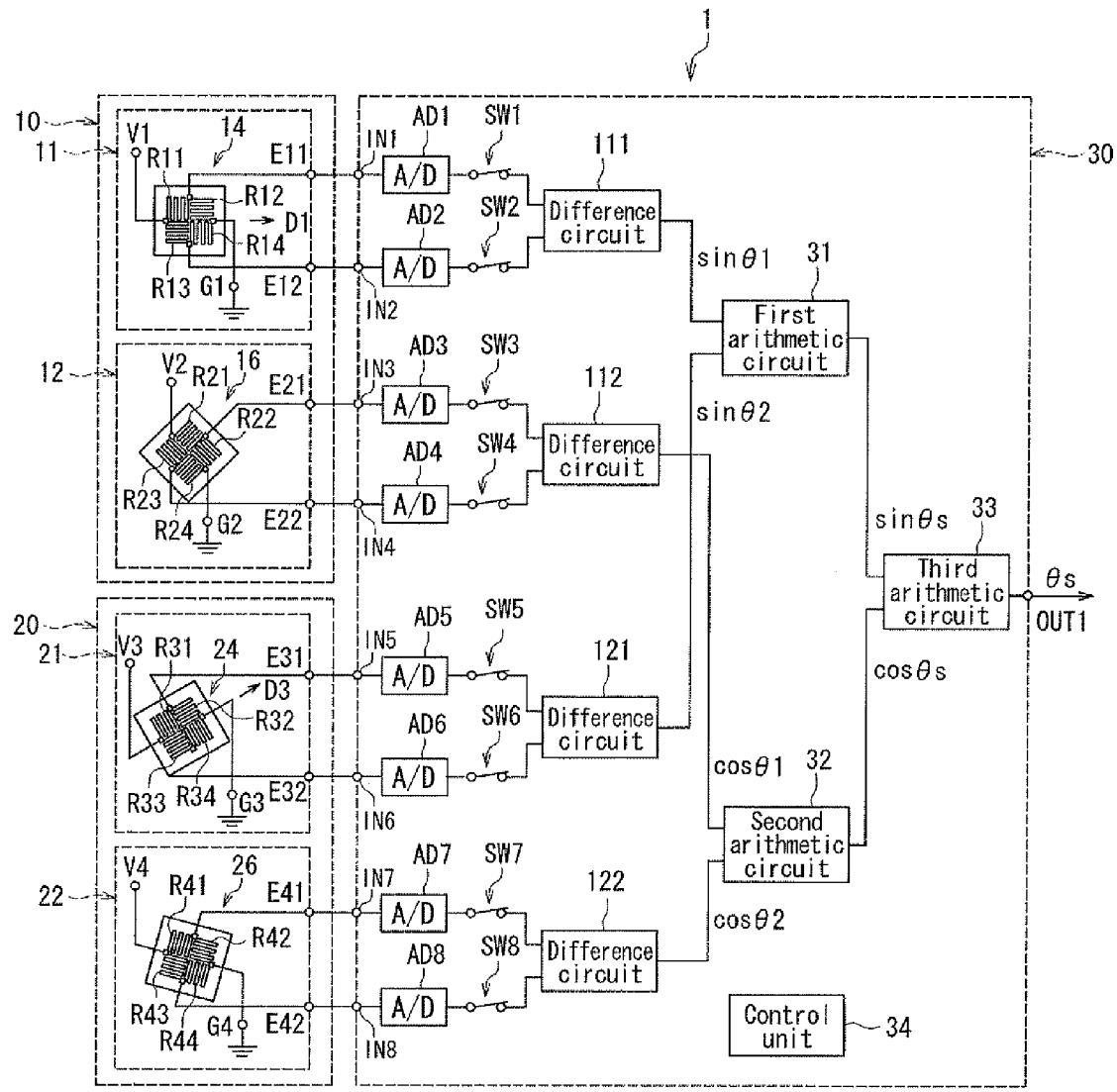
FIG. 25 is a circuit diagram showing the configuration of a rotating field sensor according to a fourth embodiment of the invention.

A rotating field sensor according to a fourth embodiment of the invention will now be described with reference to FIG. 25. FIG. 25 is a circuit diagram showing the configuration of the rotating field sensor according to the present embodiment. The rotating field sensor 1 according to the present embodiment uses anisotropic magnetoresistive (AMR) elements for all the magnetic detection elements in the bridge circuits 14, 16, 24, and 26. In this case, one rotation of the rotating magnetic field produces two periods of change of the output signals of the difference circuits 111, 112, 121, and 122 corresponding to the output signals of the detection circuits 11, 12, 21, and 22. Consequently, the output signals of the difference circuits 111, 112, 121, and 122 of the present embodiment have a period equivalent to a one-half rotation of the rotating magnetic field, which is ½ the period of the output signals of the difference circuits 111, 112, 121, and 122 of the first embodiment. In the present embodiment, the error components included in the output signals also have a period (an error component period) of ½ that in the first embodiment.

FIG. 25 also shows the first direction D1 which serves as the reference direction when the first detection circuit 11 detects the rotating magnetic field, and the third direction D3 which serves as the reference direction when the third detection circuit 21 detects the rotating magnetic field. In the example shown in FIG. 25, the third direction D3 is a direction that is rotated from the first direction D1 by −30° in the direction of rotation of the rotating magnetic field in the XY plane. The first direction D1 and the third direction D3 therefore differ from each other by 30° in the direction of rotation of the rotating magnetic field. In the present embodiment, the third direction D3 may be a direction that is rotated from the first direction D1 by 30° in the direction of rotation of the rotating magnetic field in the XY plane. The second direction (not shown), which serves as the reference direction when the second detection circuit 12 detects the rotating magnetic field, is a direction that is rotated from the first direction D1 by −45° in the direction of rotation of the rotating magnetic field. The fourth direction (not shown), which serves as the reference direction when the fourth detection circuit 22 detects the rotating magnetic field, is a direction that is rotated from the third direction D3 by −45° in the direction of rotation of the rotating magnetic field.

In the present embodiment, as in the first embodiment, the output signals sin θ1 and sin θ2 differ in phase by an integer multiple of ½ the error component period. Therefore, the error component included in the output signal sin θ1 and that included in the output signal sin θ2 cancel each other out when the first signal sin θs is generated. In the present embodiment, the output signals cos θ1 and cos θ2 also differ in phase by an integer multiple of ½ the error component period, as in the first embodiment. Therefore, the error component included in the output signal cos θ1 and that included in the output signal cos θ2 cancel each other out when the second signal cos θs is generated. Consequently, according to the present embodiment, it is possible to reduce the error in the detected angle value θs.

In the present embodiment, the magnet 102 of the second embodiment shown in FIG. 19 and FIG. 20 or the magnet 103 of the second embodiment shown in FIG. 21 and FIG. 22 may be used as the means for generating the rotating magnetic field whose direction rotates. In such a case, the first direction D1 and the third direction D3 are made to differ by 30° in the direction of rotation of the rotating magnetic field. In the case of tilting the first direction D1 and the third direction D3 as in the example shown in FIG. 20, the angles that the first direction D1 and the third direction D3 form with respect to the radial direction of the magnet 102 are preferably equal in absolute value, and more specifically, 15° and −15° (the direction in which the rotating magnetic field rotates shall be positive). Likewise, in the case of tilting the first direction D1 and the third direction D3 as in the example shown in FIG. 22, the angles that the first direction D1 and the third direction D3 form with respect to the direction orthogonal to the direction of movement of the magnet 103 are preferably equal in absolute value, and more specifically, 15° and −15° (the direction in which the rotating magnetic field rotates shall be positive).

In the present embodiment, as in the third embodiment, the first detection unit 10 and the second detection unit 20 may be located in different positions so that the first position P1 and the second position P2 are different from each other. In this case, the difference between the first position P1 and the second position P2 shall be equivalent to an integer multiple of ⅙ the signal period T, i.e., an integer multiple of ½ the error component period (other than an integer multiple of ½ the signal period T). More specifically, if the rotating field sensor 1 is to detect the direction of the rotating magnetic field generated from the outer periphery of the magnet 102 shown in FIG. 23, the difference between the first position P1 and the second position P2 shall be an integer multiple of 15° in the angle of rotation of the magnet 102 (other than an integer multiple of 45° in the angle of rotation of the magnet 102). If the rotating field sensor 1 is to detect the direction of the rotating magnetic field generated from the outer periphery of the magnet 103 shown in FIG. 24, the difference between the first position P1 and the second position P2 shall be an integer multiple of a 1/12 pitch of the magnet 103 (other than an integer multiple of a ¼ pitch of the magnet 103).

The other configuration, operation, and effects of the present embodiment are the same as those of the first, second, or third embodiment. In the present embodiment, Hall elements may be used instead of the AMR elements.

[Fifth Embodiment]

Figure 26:
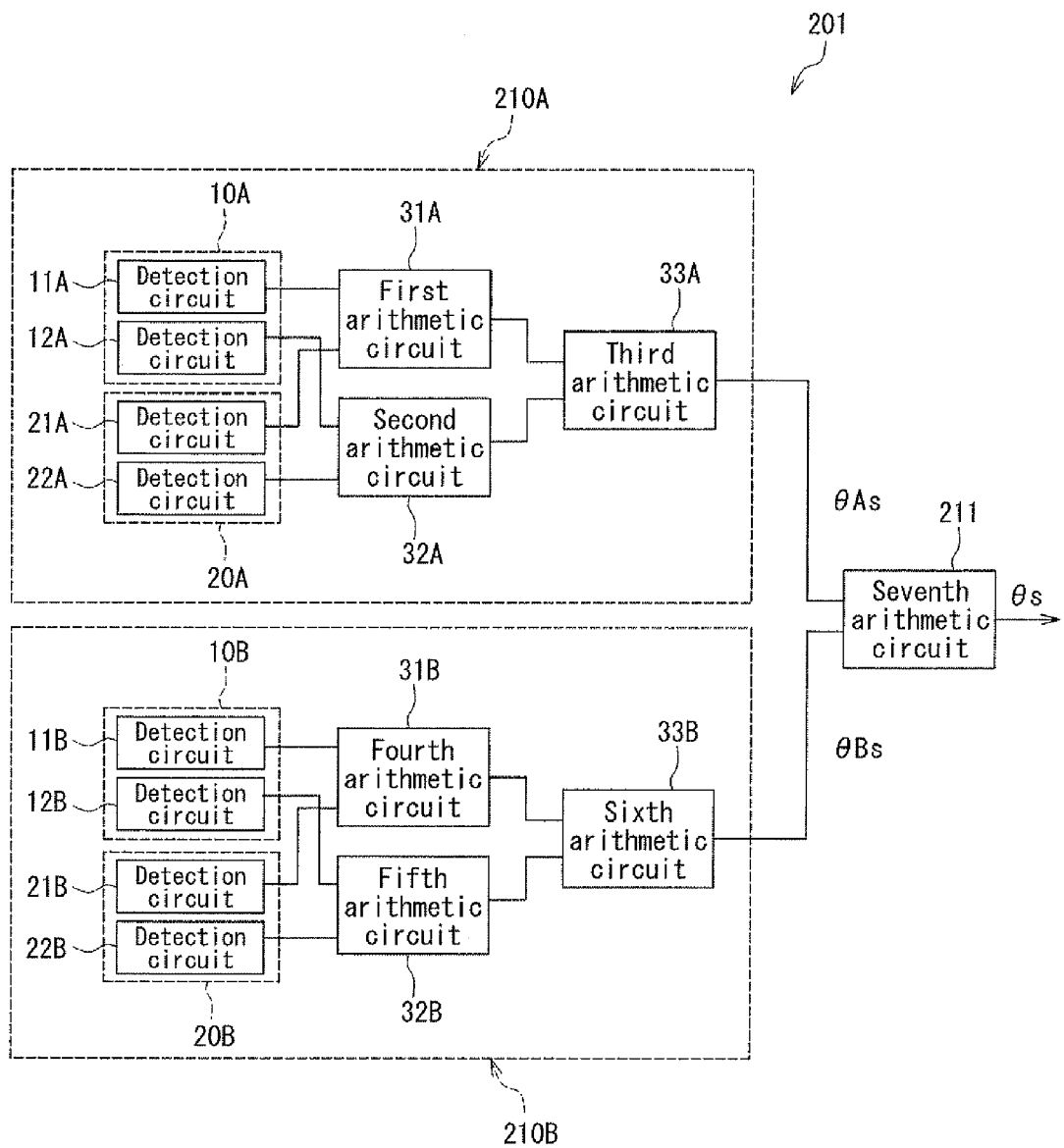
FIG. 26 is a block diagram showing the configuration of a rotating field sensor according to a fifth embodiment of the invention.
Figure 27:
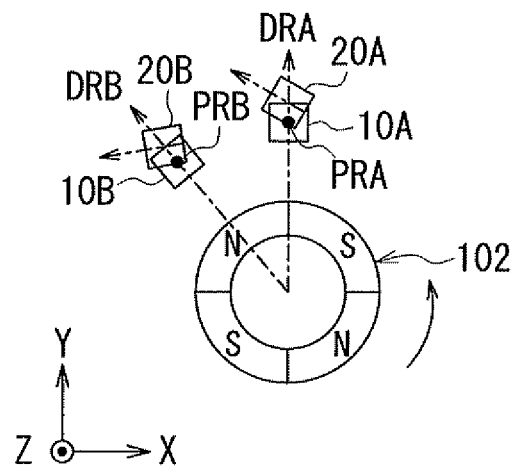
FIG. 27 is an explanatory diagram showing the configuration of the rotating field sensor according to the fifth embodiment of the invention.
Figure 28:
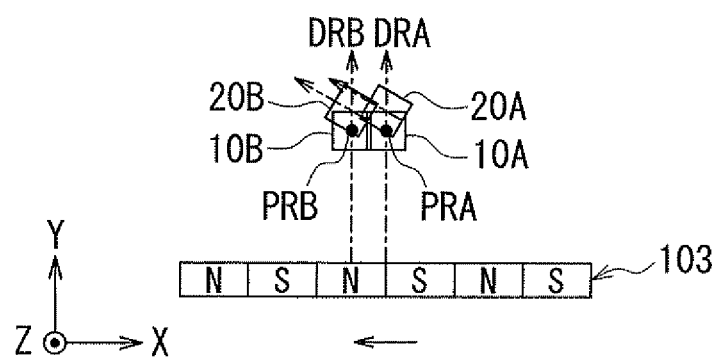
FIG. 28 is an explanatory diagram showing the configuration of a rotating field sensor of a modification example of the fifth embodiment of the invention.

A rotating field sensor according to a fifth embodiment of the invention will now be described with reference to FIG. 26 to FIG. 28. FIG. 26 is a block diagram showing the configuration of the rotating field sensor according to the present embodiment. FIG. 27 is an explanatory diagram showing the configuration of the rotating field sensor according to the present embodiment. FIG. 28 is a perspective view showing the general configuration of a rotating field sensor of a modification example of the present embodiment. First, a description will be given of the configuration of the rotating field sensor 201 according to the present embodiment. In FIG. 27, the magnet 102 of the second embodiment shown in FIG. 19 and FIG. 20 is shown as an example of the means for generating a rotating magnetic field whose direction rotates. The rotating field sensor 201 detects the direction of the rotating magnetic field generated from the outer periphery of the magnet 102, as in the examples of the second embodiment shown in FIG. 19 and FIG. 20.

As shown in FIG. 26, the rotating field sensor 201 has first and second composite detection units 210A and 210B. The first composite detection unit 210A detects an angle θA that the direction of the rotating magnetic field in a first reference position PRA forms with respect to a first reference direction DRA. The second composite detection unit 210B detects an angle θB that the direction of the rotating magnetic field in a second reference position PRB forms with respect to a second reference direction DRB. FIG. 27 shows the first and second reference positions PRA and PRB and also the first and second reference directions DRA and DRB. As shown in FIG. 27, the second reference position PRB is offset from the first reference position PRA by an amount equivalent to ¼ the period of the rotation of the rotating magnetic field, i.e., 90° in electrical angle. The first and second reference directions DRA and DRB are set to radial directions of the magnet 102. The angle θB that the direction of the rotating magnetic field in the second reference position PRB forms with respect to the second reference direction DRB differs from the angle θA that the direction of the rotating magnetic field in the first reference position PRA forms with respect to the first reference direction DRA by an angle equivalent to 90° in electrical angle.

Each of the composite detection units 210A and 210B has the same configuration as that of the rotating field sensor 1 of the first embodiment. Specifically, the first composite detection unit 210A includes a first detection unit 10A, a second detection unit 20A, a first arithmetic circuit 31A, a second arithmetic circuit 32A, and a third arithmetic circuit 33A that are the same in configuration as the first detection unit 10, the second detection unit 20, the first arithmetic circuit 31, the second arithmetic circuit 32, and the third arithmetic circuit 33, respectively. Similarly, the second composite detection unit 210B includes a third detection unit 10B, a fourth detection unit 20B, a fourth arithmetic circuit 31B, a fifth arithmetic circuit 32B, and a sixth arithmetic circuit 33B that are the same in configuration as the first detection unit 10, the second detection unit 20, the first arithmetic circuit 31, the second arithmetic circuit 32, and the third arithmetic circuit 33, respectively. In addition to the aforementioned components, although not shown in FIG. 26, each of the first and second composite detection units 210A and 210B includes the A/D converters AD1 to AD8, the switches SW1 to SW8, the difference circuits 111, 112, 121, and 122, and the control unit 34, all of which are shown in FIG. 3. The first detection unit 10A is located in a first position. The second detection unit 20A is located in a second position. The third detection unit 10B is located in a third position. The fourth detection unit 20B is located in a fourth position.

The relative positional relationship of the first and second detection units 10A and 20A with respect to the magnet 102 is the same as that of the first and second detection units 10 and 20 with respect to the magnet 102 in the second embodiment. The relative positional relationship of the third and fourth detection units 10B and 20B with respect to the magnet 102 is also the same as that of the first and second detection units 10 and 20 with respect to the magnet 102 in the second embodiment. The third and fourth detection units 10B and 20B are located in positions offset from the positions of the first and second detection units 10A and 20A, respectively, by an amount equivalent to ¼ the period of the rotation of the rotating magnetic field, i.e., as much as an electrical angle of 90°.

The position where the first detection unit 10A is located is the first position. The position where the second detection unit 20A is located is the second position. The relationships between the first reference position PRA and the first and second positions are the same as the relationships between the reference position PR and the first and second positions P1 and P2 in the first embodiment shown in FIG. 2. The first reference position PRA, the first position, and the second position respectively correspond to the reference position PR, the first position P1, and the second position P2 shown in FIG. 2. The first position and the second position are identical with each other in the direction of rotation of the rotating magnetic field and coincide with the first reference position PRA.

The first detection unit 10A detects, in the first position, a component of the rotating magnetic field in a first direction and a component of the rotating magnetic field in a second direction. The second detection unit 20A detects, in the second position, a component of the rotating magnetic field in a third direction and a component of the rotating magnetic field in a fourth direction. The relationships between the first reference direction DRA and the first to fourth directions are the same as the relationships between the reference direction DR and the first to fourth directions D1 to D4 in the first embodiment shown in FIG. 2. The first reference direction DRA, the first direction, the second direction, the third direction, and the fourth direction respectively correspond to the reference direction DR, the first direction D1, the second direction D2, the third direction D3, and the fourth direction D4 shown in FIG. 2. The first direction and the second direction are orthogonal to each other, and the third direction and the fourth direction are orthogonal to each other. The first direction and the third direction differ from each other by 60° in the direction of rotation of the rotating magnetic field. The second direction coincides with the first reference direction DRA.

The position where the third detection unit 10B is located is the third position. The position where the fourth detection unit 20B is located is the fourth position. The relationships between the second reference position PRB and the third and fourth positions are the same as the relationships between the reference position PR and the first and second positions P1 and P2 in the first embodiment shown in FIG. 2. The second reference position PRB, the third position, and the fourth position respectively correspond to the reference position PR, the first position P1, and the second position P2 shown in FIG. 2. The third position and the fourth position are identical with each other in the direction of rotation of the rotating magnetic field and coincide with the second reference position PRB.

The third detection unit 10B detects, in the third position, a component of the rotating magnetic field in a fifth direction and a component of the rotating magnetic field in a sixth direction. The fourth detection unit 20B detects, in the fourth position, a component of the rotating magnetic field in a seventh direction and a component of the rotating magnetic field in an eighth direction. The relationships between the second reference direction DRB and the fifth to eighth directions are the same as the relationships between the reference direction DR and the first to fourth directions D1 to D4 in the first embodiment shown in FIG. 2. The second reference direction DRB, the fifth direction, the sixth direction, the seventh direction, and the eighth direction respectively correspond to the reference direction DR, the first direction D1, the second direction D2, the third direction D3, and the fourth direction D4 shown in FIG. 2. The fifth direction and the sixth direction are orthogonal to each other, and the seventh direction and the eighth direction are orthogonal to each other. The fifth direction and the seventh direction differ from each other by 60° in the direction of rotation of the rotating magnetic field. The sixth direction coincides with the second reference direction DRB.

The first detection unit 10A includes a first detection circuit 11A and a second detection circuit 12A. The first detection circuit 11A and the second detection circuit 12A are the same in configuration as the first detection circuit 11 and the second detection circuit 12 of the first embodiment, respectively. The first detection circuit 11A detects the intensity of the component of the rotating magnetic field in the first direction and outputs a signal indicating the intensity. The second detection circuit 12A detects the intensity of the component of the rotating magnetic field in the second direction and outputs a signal indicating the intensity. The first direction serves as a reference direction when the first detection circuit 11A detects the rotating magnetic field. The second direction serves as a reference direction when the second detection circuit 12A detects the rotating magnetic field.

The second detection unit 20A includes a third detection circuit 21A and a fourth detection circuit 22A. The third detection circuit 21A and the fourth detection circuit 22A are the same in configuration as the third detection circuit 21 and the fourth detection circuit 22 of the first embodiment, respectively. The third detection circuit 21A detects the intensity of the component of the rotating magnetic field in the third direction and outputs a signal indicating the intensity. The fourth detection circuit 22A detects the intensity of the component of the rotating magnetic field in the fourth direction and outputs a signal indicating the intensity. The third direction serves as a reference direction when the third detection circuit 21A detects the rotating magnetic field. The fourth direction serves as a reference direction when the fourth detection circuit 22A detects the rotating magnetic field.

The third detection unit 10B includes a fifth detection circuit 11B and a sixth detection circuit 12B. The fifth detection circuit 11B and the sixth detection circuit 12B are the same in configuration as the first detection circuit 11 and the second detection circuit 12 of the first embodiment, respectively. The fifth detection circuit 11B detects the intensity of the component of the rotating magnetic field in the fifth direction and outputs a signal indicating the intensity. The sixth detection circuit 12B detects the intensity of the component of the rotating magnetic field in the sixth direction and outputs a signal indicating the intensity. The fifth direction serves as a reference direction when the fifth detection circuit 11B detects the rotating magnetic field. The sixth direction serves as a reference direction when the sixth detection circuit 12B detects the rotating magnetic field.

The fourth detection unit 20B includes a seventh detection circuit 21B and an eighth detection circuit 22B. The seventh detection circuit 21B and the eighth detection circuit 22B are the same in configuration as the third detection circuit 21 and the fourth detection circuit 22 of the first embodiment, respectively. The seventh detection circuit 21B detects the intensity of the component of the rotating magnetic field in the seventh direction and outputs a signal indicating the intensity. The eighth detection circuit 22B detects the intensity of the component of the rotating magnetic field in the eighth direction and outputs a signal indicating the intensity. The seventh direction serves as a reference direction when the seventh detection circuit 21B detects the rotating magnetic field. The eighth direction serves as a reference direction when the eighth detection circuit 22B detects the rotating magnetic field.

In the example shown in FIG. 27, the magnet 102 includes two pairs of N and S poles, and one rotation of the magnet 102 produces two rotations of the rotating magnetic field. In this case, one period of the output signals of the detection circuits 11A, 12A, 21A, 22A, 11B, 12B, 21B, and 22B, i.e., an electrical angle of 360°, is equivalent to a one-half rotation of the magnet 102, i.e., an angle of rotation of 180° of the magnet 102. The output signals of the first to eighth detection circuits 11A, 12A, 21A, 22A, 11B, 12B, 21B, and 22B make periodic changes with the same signal period T. The output signal of the third detection circuit 21A differs from the output signal of the first detection circuit 11A in phase. The output signal of the fourth detection circuit 22A differs from the output signal of the second detection circuit 12A in phase. The output signal of the seventh detection circuit 21B differs from the output signal of the fifth detection circuit 11B in phase. The output signal of the eighth detection circuit 22B differs from the output signal of the sixth detection circuit 12B in phase. In the present embodiment, the phases of the output signals of the first to eighth detection circuits 11A, 12A, 21A, 22A, 11B, 12B, 21B, and 22B preferably satisfy the following particular relationships.

Preferably, the output signal of the second detection circuit 12A differs from the output signal of the first detection circuit 11A in phase by an odd number of times ¼ the signal period T. Also preferably, the output signal of the fourth detection circuit 22A differs from the output signal of the third detection circuit 21A in phase by an odd number of times ¼ the signal period T. However, in consideration of the production accuracy of the magnetic detection elements and other factors, the difference in phase between the output signal of the first detection circuit 11A and the output signal of the second detection circuit 12A and the difference in phase between the output signal of the third detection circuit 21A and the output signal of the fourth detection circuit 22A can each be slightly different from an odd number of times ¼ the signal period T. Preferably, the output signal of the third detection circuit 21A differs from the output signal of the first detection circuit 11A in phase by an integer multiple of ⅙ the signal period T other than an integer multiple of ½ the signal period T.

Preferably, the output signal of the sixth detection circuit 12B differs from the output signal of the fifth detection circuit 11B in phase by an odd number of times ¼ the signal period T. Also preferably, the output signal of the eighth detection circuit 22B differs from the output signal of the seventh detection circuit 21B in phase by an odd number of times ¼ the signal period T. However, in consideration of the production accuracy of the magnetic detection elements and other factors, the difference in phase between the output signal of the fifth detection circuit 11B and the output signal of the sixth detection circuit 12B and the difference in phase between the output signal of the seventh detection circuit 21B and the output signal of the eighth detection circuit 22B can each be slightly different from an odd number of times ¼ the signal period T. Preferably, the output signal of the seventh detection circuit 21B differs from the output signal of the fifth detection circuit 11B in phase by an integer multiple of ⅙ the signal period T other than an integer multiple of ½ the signal period T. The following description assumes that the phases of the output signals of the first to eighth detection circuits 11A, 12A, 21A, 22A, 11B, 12B, 21B, and 22B satisfy the preferred relationships described above.

The first arithmetic circuit 31A generates, based on the output signals of the first and third detection circuits 11A and 21A, a first signal that has a correspondence relationship with both the intensity of the component of the rotating magnetic field in the first direction and the intensity of the component of the rotating magnetic field in the third direction. The first signal includes a reduced error component with a period of ⅓ the signal period T, as compared with the output signals of the first and third detection circuits 11A and 21A. The second arithmetic circuit 32A generates, based on the output signals of the second and fourth detection circuits 12A and 22A, a second signal that has a correspondence relationship with both the intensity of the component of the rotating magnetic field in the second direction and the intensity of the component of the rotating magnetic field in the fourth direction. The second signal includes a reduced error component with a period of ⅓ the signal period T, as compared with the output signals of the second and fourth detection circuits 12A and 22A. Based on the first signal and the second signal, the third arithmetic circuit 33A calculates a detected value of the angle $\theta A$ that the direction of the rotating magnetic field in the first reference position PRA forms with respect to the first reference direction DRA. Hereinafter, the detected value calculated by the third arithmetic circuit 33A will be referred to as a first detected angle value and denoted by symbol $\theta As$. The first detected angle value $\theta As$ is calculated by the same method as with the detected angle value $\theta s$ in the first embodiment. Leaving errors aside, the first detected angle value $\theta As$ has a difference of constant value (including 0) from the angle that the direction of the rotating magnetic field in a reference position forms with respect to a reference direction. The first detected angle value $\theta As$ thus has a correspondence relationship with the angle that the direction of the rotating magnetic field in the reference position forms with the respect to the reference direction.

The fourth arithmetic circuit 31B generates, based on the output signals of the fifth and seventh detection circuits 11B and 21B, a third signal that has a correspondence relationship with both the intensity of the component of the rotating magnetic field in the fifth direction and the intensity of the component of the rotating magnetic field in the seventh direction. The third signal includes a reduced error component with a period of ⅓ the signal period T, as compared with the output signals of the fifth and seventh detection circuits 11B and 21B. The fifth arithmetic circuit 32B generates, based on the output signals of the sixth and eighth detection circuits 12B and 22B, a fourth signal that has a correspondence relationship with both the intensity of the component of the rotating magnetic field in the sixth direction and the intensity of the component of the rotating magnetic field in the eighth direction. The fourth signal includes a reduced error component with a period of ⅓ the signal period T, as compared with the output signals of the sixth and eighth detection circuits 12B and 22B. Based on the third signal and the fourth signal, the sixth arithmetic circuit 33B calculates a detected value of the angle $\theta B$ that the direction of the rotating magnetic field in the second reference position PRB forms with respect to the second reference direction DRB. Hereinafter, the detected value calculated by the sixth arithmetic circuit 33B will be referred to as a second detected angle value and denoted by symbol $\theta Bs$. The second detected angle value $\theta Bs$ is calculated by the same method as with the detected angle value $\theta s$ in the first embodiment. Leaving errors aside, the second detected angle value $\theta Bs$ has a difference of constant value (including 0) from the angle that the direction of the rotating magnetic field in a reference position forms with respect to a reference direction. The second detected angle value $\theta Bs$ thus has a correspondence relationship with the angle that the direction of the rotating magnetic field in the reference position forms with the respect to the reference direction.

As shown in FIG. 26, the rotating field sensor 201 further includes a seventh arithmetic circuit 211 that calculates a detected angle value $\theta s$ having a correspondence relationship with the angle that the direction of the rotating magnetic field in a reference position of the rotating field sensor 201 forms with respect to a reference direction of the rotating field sensor 201. The seventh arithmetic circuit 211 calculates the detected angle value $\theta s$ based on the first detected angle value $\theta As$ calculated by the third arithmetic circuit 33A and the second detected angle value $\theta Bs$ calculated by the sixth arithmetic circuit 33B. The seventh arithmetic circuit 211 can be implemented by a microcomputer, for example. The reference position and the reference direction of the rotating field sensor 201 may coincide with the first reference position PRA and the first reference direction DRA, respectively, or with the second reference position PRB and the second reference direction DRB, respectively, or may be any position and direction different from those positions and directions.

Reference is now made to FIG. 28 to describe the configuration of a rotating field sensor 201 of a modification example of the present embodiment. In FIG. 28, the magnet 103 of the second embodiment shown in FIG. 21 and FIG. 22 is shown as an example of the means for generating the rotating magnetic field whose direction rotates. The rotating field sensor 201 of the modification example detects the direction of the rotating magnetic field generated from the outer periphery of the magnet 103, as in the examples of the second embodiment shown in FIG. 21 and FIG. 22.

FIG. 28 shows the first and second reference positions PRA and PRB and also the first and second reference directions DRA and DRB. As shown in FIG. 28, the second reference position PRB is offset from the first reference position PRA by an amount equivalent to ¼ the period of the rotation of the rotating magnetic field or 90° in electrical angle, i.e., as much as a one-fourth pitch of the magnet 103. In the example shown in FIG. 28, the first and second reference directions DRA and DRB are both set to a direction orthogonal to the direction of movement of the magnet 103 in the XY plane.

The relative positional relationship of the first and second detection units 10A and 20A with respect to the magnet 103 is the same as that of the first and second detection units 10 and 20 with respect to the magnet 103 in the second embodiment. The relative positional relationship of the third and fourth detection units 10B and 20B with respect to the magnet 103 is also the same as that of the first and second detection units 10 and 20 with respect to the magnet 103 in the second embodiment. In the modification example, the third and fourth detection units 10B and 20B are located in positions offset from the positions of the first and second detection units 10A and 20A, respectively, by an amount equivalent to ¼ the period of the rotation of the rotating magnetic field or 90° in electrical angle, i.e., as much as a one-fourth pitch of the magnet 103.

Next, a description will be given of the method by which the seventh arithmetic circuit 211 calculates the detected angle value $\theta s$. In the present embodiment, the seventh arithmetic circuit 211 calculates the detected angle value $\theta s$ based on the first detected angle value θAs calculated by the third arithmetic circuit 33A of the composite detection unit 210A and the second detected angle value θBs calculated by the sixth arithmetic circuit 33B of the composite detection unit 210B. In the examples shown in FIG. 27 and FIG. 28, the third and fourth detection units 10B and 20B of the composite detection unit 210B are located in positions offset from the positions of the first and second detection units 10A and 20A of the composite detection unit 210A by an amount equivalent to an electrical angle of 90°. The first detected angle value θAs obtained by the composite detection unit 210A and the second detected angle value θBs obtained by the composite detection unit 210B therefore differ in phase by an electrical angle of 90°. In such examples, the seventh arithmetic circuit 211 calculates θs by the equation (6) below.

$$θs=(θAs+θBs+π/2)/2 \qquad (6)$$

Next, the operation and effects of the rotating field sensor 201 will be described. In the rotating field sensor 201, the third arithmetic circuit 33A calculates the first detected angle value θAs based on the first signal and the second signal. The first signal is generated based on the output signals of the first and third detection circuits 11A and 21A, and the second signal is generated based on the output signals of the second and fourth detection circuits 12A and 22A. In the rotating field sensor 201, the sixth arithmetic circuit 3313 calculates the second detected angle value θBs based on the third signal and the fourth signal. The third signal is generated based on the output signals of the fifth and seventh detection circuits 1113 and 21B, and the fourth signal is generated based on the output signals of the sixth and eighth detection circuits 12B and 22B. Based on the first detected angle value θAs and the second detected angle value θBs, the seventh arithmetic circuit 211 calculates, by using the equation (6), the detected angle value θs that has a correspondence relationship with the angle that the direction of the rotating magnetic field in the reference position forms with respect to the reference direction.

Figure 29:
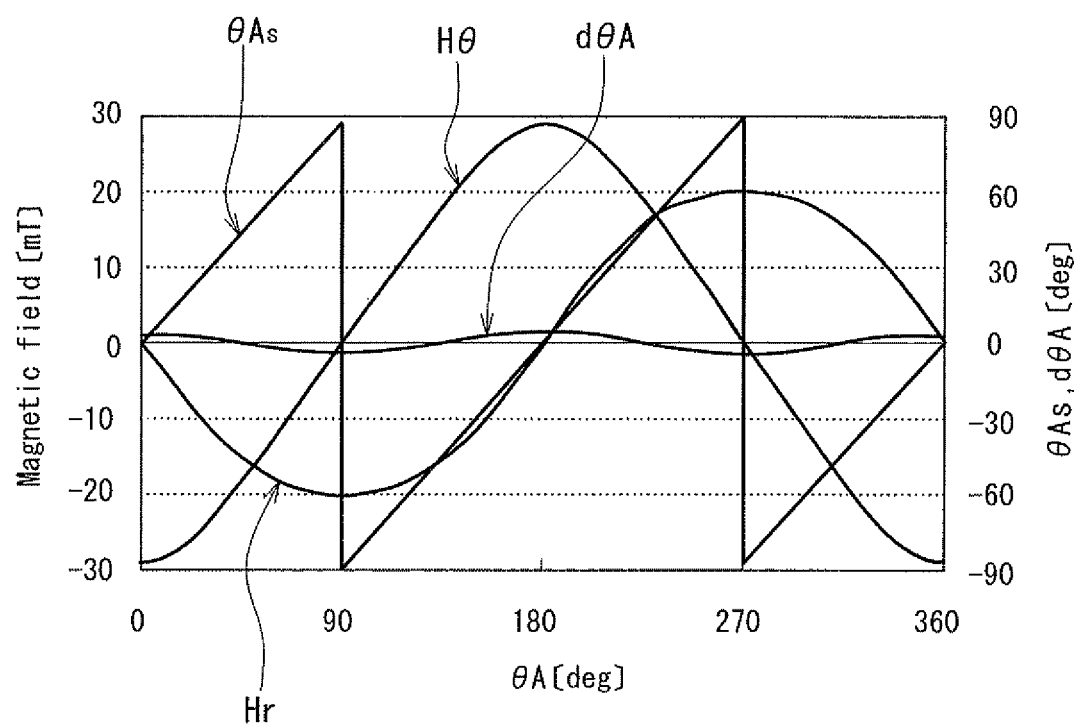
FIG. 29 is a waveform chart showing the relationship between a rotating magnetic field, a first detected angle value, and a first angular error in the fifth embodiment of the invention.

The rotating field sensor 201 according to the present embodiment is suitable for reducing angular errors resulting from the rotating magnetic field. Reference is now made to FIG. 27 to FIG. 29 to describe the reason for the occurrence of angular errors due to the rotating magnetic field. In the example shown in FIG. 27, the rotating magnetic field includes a not-shown component Hr in the radial direction of the magnet 102, and a not-shown component Hθ in the direction orthogonal to Hr in the XY plane. In the example shown in FIG. 28, the rotating magnetic field includes a not-shown component Hr in the direction orthogonal to the direction of movement of the magnet 103 in the XY plane, and a not-shown component Hθ in the direction orthogonal to Hr in the XY plane.

Suppose, in the example shown in FIG. 27 or FIG. 28, that the rotating magnetic field is detected by the first and second detection units 10A and 20A and then the first detected angle value θAs is obtained based on the output signals of the detection units 10A and 20A. FIG. 29 shows an example of the relationship between Hr, Hθ, θAs, and a first angular error dθA in such a case. In FIG. 29, the horizontal axis indicates the angle θA, and the vertical axis indicates Hr, Hθ, θAs, and dθA. For the sake of convenience, FIG. 29 shows θAs on the vertical axis in values after a subtraction of 180° if the actual angle is in the range of 90° to 270°, and in values after a subtraction of 360° if the actual angle is in the range of 270° to 360°. In the following description, charts similar to FIG. 29 will be shown in the same way as with FIG. 29. For ease of understanding, FIG. 29 shows the waveform of the first angular error dθA with exaggerated amplitude. In the example shown in FIG. 27 or FIG. 28, the direction of the rotating magnetic field and the intensity of a component of the rotating magnetic field in one direction sometimes fail to make a sinusoidal change. In such a case, the first detected angle value θAs includes a first angular error dθA with respect to a theoretical value of the first detected angle value θAs that is expected when the direction of the rotating magnetic field rotates ideally. Similarly, when the third and fourth detection units 10B and 20B detect the rotating magnetic field and then the second detected angle value θBs is obtained based on the output signals of the detection units 10B and 20B, the second detected angle value θBs includes a second angular error dθB with respect to a theoretical value of the second detected angle value θBs that is expected when the direction of the rotating magnetic field rotates ideally. The first and second angular errors dθA and dθB make periodic changes with the same angular error period in response to a change of the direction of the rotating magnetic field. The changes of the first and second angular errors dθA and dθB depend on the change of the direction of the rotating magnetic field. The angular error period is ½ the period of the rotation of the direction of the rotating magnetic field.

Figure 30:
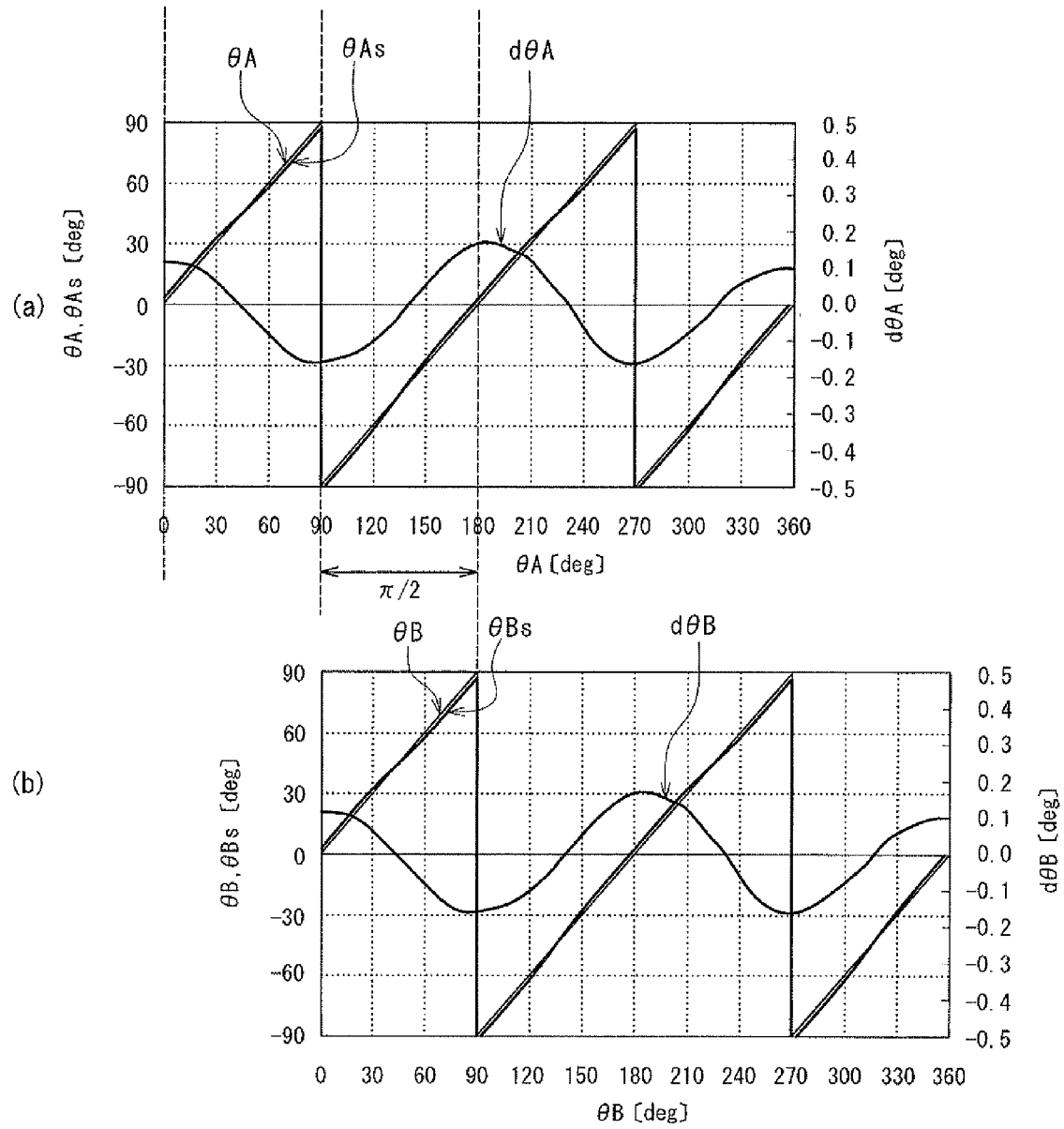
FIG. 30 is an explanatory diagram showing the operation of reducing an angular error in the fifth embodiment of the invention.

Next, with reference to FIG. 30 and FIG. 31, a description will be given of how the rotating field sensor 201 can be used to reduce the angular errors resulting from the rotating magnetic field. Portion (a) of FIG. 30 shows the relationship between the first detected angle value θAs and the first angular error dθA included in the first detected angle value θAs. Portion (b) of FIG. 30 shows the relationship between the second detected angle value θBs and the second angular error dθB included in the second detected angle value θBs. In the example shown in FIG. 30, the first angular error dθA and the second angular error dθB have an amplitude of ±0.17°. In the present embodiment, the third position and the fourth position are offset from the first position and the second position, respectively, by an amount equivalent to ½ the angular error period (90° in electrical angle), and the first and second detected angle values θAs and θBs differ in phase by ½ the angular error period (90° in electrical angle). Therefore, when calculating the detected angle value θs, the first angular error dθA and the second angular error dθB are in opposite phases. Consequently, the first angular error dθA and the second angular error dθB cancel each other out.

Figure 31:
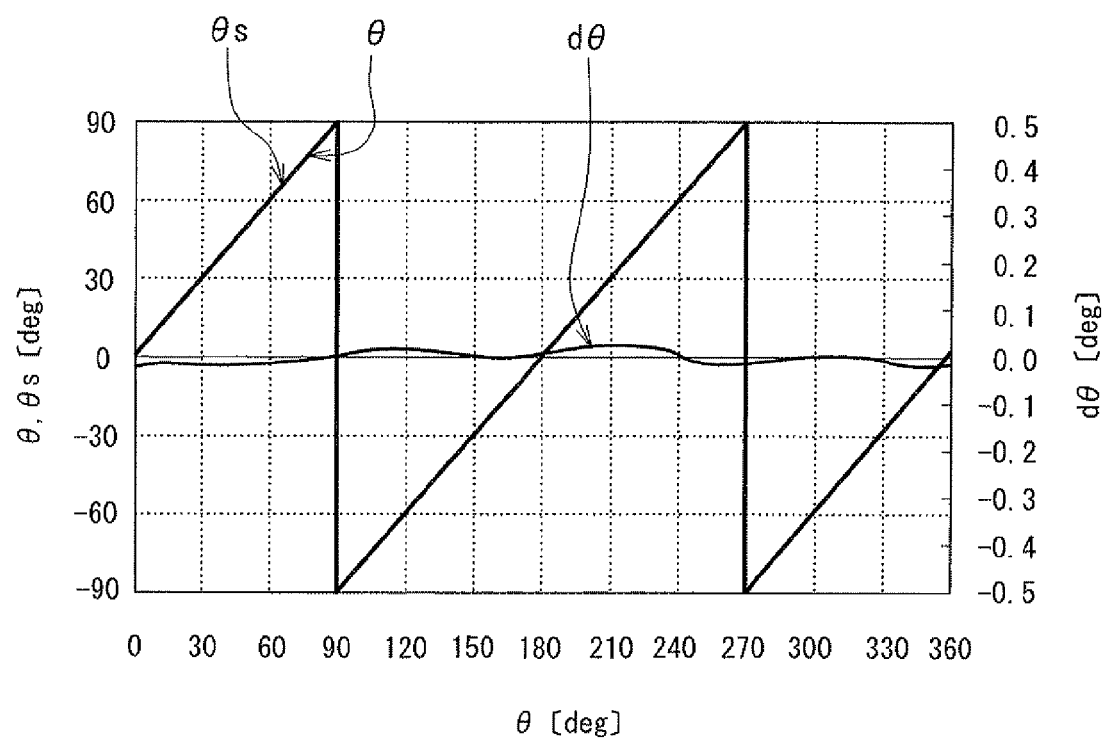
FIG. 31 is a waveform chart showing the relationship between a detected angle value and an angular error in the fifth embodiment of the invention.

FIG. 31 shows the relationship between the detected angle value θs calculated as described above and an angular error dθ included in the detected angle value θs. In FIG. 31, symbol θ represents the angle that the direction of the rotating magnetic field in the reference position forms with respect to the reference direction. As shown in FIG. 31, the angular error dθ is significantly smaller than the first angular error dθA and the second angular error dθB. In the example shown in FIG. 31, the angular error dθ has an amplitude of ±0.03°.

In the present embodiment, the third position and the fourth position are offset from the first position and the second position, respectively, by an amount equivalent to ½ the angular error period. However, the third position and the fourth position may be offset from the first position and the second position by an amount equivalent to an odd number of times ½ the angular error period. In such a case, the angular error dθA and the angular error dθB cancel each other out to significantly reduce the angular error dθ included in the detected angle value θs.

In the present embodiment, the phase difference between the first detected angle value θAs and the second detected angle value θBs is not limited to 90° in electrical angle, and may be of any value. Assuming that the phase difference between the first detected angle value θAs and the second detected angle value θBs is β, the seventh arithmetic circuit 211 calculates θs by the equation (7) below.

$$\theta s = (\theta As + \theta Bs + \beta)/2 \quad (7)$$

In the present embodiment, the first detected angle value θAs is calculated by the same method as with the detected angle value θs in the first embodiment. Consequently, as discussed in relation to the first embodiment, if the output signal waveforms of the MR elements are distorted due to the MR elements themselves, the error component included in the output signal of the first detection circuit 11A and the error component included in the output signal of the third detection circuit 21A are in opposite phases when the first signal is generated, and the error component included in the output signal of the second detection circuit 12A and the error component included in the output signal of the fourth detection circuit 22A are in opposite phases when the second signal is generated. For the same reason as in the description of the first embodiment, the present embodiment thus makes it possible to reduce the error in the first detected angle value θAs resulting from the MR elements.

In the present embodiment, the second detected angle value θBs is calculated by the same method as with the detected angle value θs in the first embodiment. Consequently, as discussed in relation to the first embodiment, if the output signal waveforms of the MR elements are distorted due to the MR elements themselves, the error component included in the output signal of the fifth detection circuit 11B and the error component included in the output signal of the seventh detection circuit 21B are in opposite phases when the third signal is generated, and the error component included in the output signal of the sixth detection circuit 12B and the error component included in the output signal of the eighth detection circuit 22B are in opposite phases when the fourth signal is generated. For the same reason as in the description of the first embodiment, the present embodiment thus makes it possible to reduce the error in the second detected angle value θBs resulting from the MR elements. As described above, according to the present embodiment, it is possible to reduce the error resulting from the MR elements in each of the first and second detected angle values θAs and θBs. This makes it possible to reduce the error resulting from the MR elements even in the detected angle value θs, the final result.

The other configuration, operation, and effects of the present embodiment are the same as those of the second embodiment.

The present invention is not limited to the foregoing embodiments, and various modifications may be made thereto. For example, the arrangement of the plurality of detection units in the foregoing embodiments are illustrative only. Various modifications may be made to the arrangement of the plurality of detection units within the scope of the requirements set forth in the claims.

It is apparent that the present invention can be carried out in various forms and modifications in the light of the foregoing descriptions. Accordingly, within the scope of the following claims and equivalents thereof, the present invention can be carried out in forms other than the foregoing most preferable embodiments.

What is claimed is:

1. A rotating field sensor for detecting an angle that a direction of a rotating magnetic field in a reference position forms with respect to a reference direction, the rotating field sensor comprising:
 a first detection unit that detects the rotating magnetic field in a first position; and
 a second detection unit that detects the rotating magnetic field in a second position, wherein:
 the first detection unit has a first detection circuit that detects an intensity of a component of the rotating magnetic field in a first direction and outputs a signal indicating the intensity, and a second detection circuit that detects an intensity of a component of the rotating magnetic field in a second direction and outputs a signal indicating the intensity;
 the second detection unit has a third detection circuit that detects an intensity of a component of the rotating magnetic field in a third direction and outputs a signal indicating the intensity, and a fourth detection circuit that detects an intensity of a component of the rotating magnetic field in a fourth direction and outputs a signal indicating the intensity;
 each of the first to fourth detection circuits includes at least one magnetic detection element;
 the output signals of the first to fourth detection circuits make periodic changes with one signal period;
 the output signals of the first to fourth detection circuits are all distorted from an ideal sinusoidal curve to a shape between the ideal sinusoidal curve and a triangular waveform, or all distorted from the ideal sinusoidal curve to a shape between the ideal sinusoidal curve and a rectangular waveform;
 the output signal of the third detection circuit differs from the output signal of the first detection circuit in phase; and
 the output signal of the fourth detection circuit differs from the output signal of the second detection circuit in phase,
 the rotating field sensor further comprising:
 a first arithmetic circuit that generates, based on the output signals of the first and third detection circuits, a first signal having a correspondence relationship with both the intensity of the component of the rotating magnetic field in the first direction and the intensity of the component of the rotating magnetic field in the third direction, the first signal including a reduced error component with a period of ⅓ the one signal period, as compared with the output signals of the first and third detection circuits;
 a second arithmetic circuit that generates, based on the output signals of the second and fourth detection circuits, a second signal having a correspondence relationship with both the intensity of the component of the rotating magnetic field in the second direction and the intensity of the component of the rotating magnetic field in the fourth direction, the second signal including a reduced error component with a period of ⅓ the one signal period, as compared with the output signals of the second and fourth detection circuits; and
 a third arithmetic circuit that calculates, based on the first and second signals, a detected angle value having a correspondence relationship with the angle that the direction of the rotating magnetic field in the reference position forms with respect to the reference direction.

2. The rotating field sensor according to claim 1, wherein:
 the output signal of the second detection circuit differs from the output signal of the first detection circuit in phase by an odd number of times ¼ the one signal period;
 the output signal of the third detection circuit differs from the output signal of the first detection circuit in phase by an integer multiple of ⅙ the one signal period other than an integer multiple of ½ the one signal period; and the output signal of the fourth detection circuit differs from the output signal of the third detection circuit in phase by an odd number of times ¼ the one signal period.

3. The rotating field sensor according to claim 2, wherein the first position and the second position are identical with each other in the direction of rotation of the rotating magnetic field, and the first direction and the third direction are different from each other in the direction of rotation of the rotating magnetic field by a spatial angle equivalent to an integer multiple of ⅙ the one signal period other than an integer multiple of ½ the one signal period.

4. The rotating field sensor according to claim 2, wherein the first position and the second position are different from each other, and the difference between the first position and the second position is equivalent to an integer multiple of ⅙ the one signal period other than an integer multiple of ½ the one signal period.

5. The rotating field sensor according to claim 1, wherein each of the first to fourth detection circuits includes, as the at least one magnetic detection element, a pair of magnetic detection elements connected in series.

6. The rotating field sensor according to claim 5, wherein each of the first to fourth detection circuits has a Wheatstone bridge circuit that includes a first pair of magnetic detection elements connected in series and a second pair of magnetic detection elements connected in series.

7. The rotating field sensor according to claim 5, wherein the magnetic detection elements are magnetoresistive elements.

8. The rotating field sensor according to claim 7, wherein each of the magnetoresistive elements has a magnetization pinned layer whose direction of magnetization is pinned, a free layer whose direction of magnetization varies according to the direction of the rotating magnetic field, and a nonmagnetic layer disposed between the magnetization pinned layer and the free layer.

9. The rotating field sensor according to claim 8, wherein:
the directions of magnetization of the magnetization pinned layers of the magnetoresistive elements in the second detection circuit are orthogonal to those of the magnetization pinned layers of the magnetoresistive elements in the first detection circuit; and
the directions of magnetization of the magnetization pinned layers of the magnetoresistive elements in the fourth detection circuit are orthogonal to those of the magnetization pinned layers of the magnetoresistive elements in the third detection circuit.

10. The rotating field sensor according to claim 1, further comprising:
a third detection unit that detects the rotating magnetic field in a third position; and
a fourth detection unit that detects the rotating magnetic field in a fourth position, wherein:
the third detection unit has a fifth detection circuit that detects an intensity of a component of the rotating magnetic field in a fifth direction and outputs a signal indicating the intensity, and a sixth detection circuit that detects an intensity of a component of the rotating magnetic field in a sixth direction and outputs a signal indicating the intensity;
the fourth detection unit has a seventh detection circuit that detects an intensity of a component of the rotating magnetic field in a seventh direction and outputs a signal indicating the intensity, and an eighth detection circuit that detects an intensity of a component of the rotating magnetic field in an eighth direction and outputs a signal indicating the intensity;

each of the fifth to eighth detection circuits includes at least one magnetic detection element;
the output signals of the first to eighth detection circuits make periodic changes with the one signal period;
the output signal of the seventh detection circuit differs from the output signal of the fifth detection circuit in phase; and
the output signal of the eighth detection circuit differs from the output signal of the sixth detection circuit in phase,
the rotating field sensor further comprising:
a fourth arithmetic circuit that generates, based on the output signals of the fifth and seventh detection circuits, a third signal having a correspondence relationship with both the intensity of the component of the rotating magnetic field in the fifth direction and the intensity of the component of the rotating magnetic field in the seventh direction, the third signal including a reduced error component with a period of ⅓ the one signal period, as compared with the output signals of the fifth and seventh detection circuits;
a fifth arithmetic circuit that generates, based on the output signals of the sixth and eighth detection circuits, a fourth signal having a correspondence relationship with both the intensity of the component of the rotating magnetic field in the sixth direction and the intensity of the component of the rotating magnetic field in the eighth direction, the fourth signal including a reduced error component with a period of ⅓ the one signal period, as compared with the output signals of the sixth and eighth detection circuits;
a sixth arithmetic circuit that calculates, based on the third and fourth signals, a second detected angle value having a correspondence relationship with the angle that the direction of the rotating magnetic field in the reference position forms with respect to the reference direction; and
a seventh arithmetic circuit that calculates a detected value of the angle that the direction of the rotating magnetic field in the reference position forms with respect to the reference direction, based on a first detected angle value, which is the detected angle value calculated by the third arithmetic circuit, and the second detected angle value calculated by the sixth arithmetic circuit.

11. The rotating field sensor according to claim 10, wherein:
the output signal of the second detection circuit differs from the output signal of the first detection circuit in phase by an odd number of times ¼ the one signal period;
the output signal of the third detection circuit differs from the output signal of the first detection circuit in phase by an integer multiple of ⅙ the one signal period other than an integer multiple of ½ the one signal period;
the output signal of the fourth detection circuit differs from the output signal of the third detection circuit in phase by an odd number of times ¼ the one signal period;
the output signal of the sixth detection circuit differs from the output signal of the fifth detection circuit in phase by an odd number of times ¼ the one signal period;
the output signal of the seventh detection circuit differs from the output signal of the fifth detection circuit in phase by an integer multiple of ⅙ the one signal period other than an integer multiple of ½ the one signal period; and
the output signal of the eighth detection circuit differs from the output signal of the seventh detection circuit in phase by an odd number of times ¼ the one signal period.

12. The rotating field sensor according to claim 10, wherein:
- the first detected angle value includes a first angular error with respect to a theoretical value of the first detected angle value that is expected when the direction of the rotating magnetic field rotates ideally;
- the second detected angle value includes a second angular error with respect to a theoretical value of the second detected angle value that is expected when the direction of the rotating magnetic field rotates ideally;
- the first and second angular errors make periodic changes with the same angular error period in response to a change of the direction of the rotating magnetic field, the changes of the first angular error and the second angular error depending on the change of the direction of the rotating magnetic field; and
- the third position and the fourth position are offset from the first position and the second position, respectively, by an amount equivalent to an odd number of times ½ the angular error period.

13. The rotating field sensor according to claim 12, wherein the angular error period is ½ the period of the rotation of the direction of the rotating magnetic field.

* * * * *